(12) United States Patent
Wood

(10) Patent No.: US 7,283,594 B1
(45) Date of Patent: Oct. 16, 2007

(54) IMPEDANCE MODULATION SIGNALING

(75) Inventor: John Wood, Northamptonshire (GB)

(73) Assignee: New Transducers Limited, London (GB)

( * ) Notice: Subject to any disclaimer, the term of this patent is extended or adjusted under 35 U.S.C. 154(b) by 1528 days.

(21) Appl. No.: 09/613,588

(22) Filed: Jul. 10, 2000

Related U.S. Application Data

(63) Continuation of application No. PCT/GB99/00008, filed on Jan. 11, 1999.

(30) Foreign Application Priority Data

Jan. 10, 1998 (GB) .................................. 9800440.1

(51) Int. Cl.
*H04L 27/10* (2006.01)
*H04Q 5/22* (2006.01)

(52) U.S. Cl. ............... 375/278; 340/10.1; 340/10.4

(58) Field of Classification Search ............ 375/144, 375/293, 257–258, 356, 358; 324/512, 533–534; 389/154; 340/825.49, 928, 10.1, 10.4; 370/278, 370/282; 455/69, 70
See application file for complete search history.

(56) References Cited

U.S. PATENT DOCUMENTS

| | | | |
|---|---|---|---|
| 3,303,284 A * | 2/1967 | Lender | 375/362 |
| 3,668,640 A * | 6/1972 | Driscoll | 340/825.49 |
| 3,691,519 A * | 9/1972 | Wolf | 340/928 |
| 3,758,719 A | 9/1973 | Klose | 178/58 R |
| 3,798,608 A * | 3/1974 | Huebner | 375/258 |
| 4,361,904 A * | 11/1982 | Matsumura | 455/67.7 |
| 4,649,335 A * | 3/1987 | Lassaux et al. | 324/512 |
| 4,701,938 A * | 10/1987 | Bell | 375/257 |
| 5,521,512 A * | 5/1996 | Hulina | 324/533 |
| 5,586,054 A * | 12/1996 | Jensen et al. | 324/533 |
| 5,587,934 A * | 12/1996 | Oldfield et al. | 702/85 |
| 5,646,758 A * | 7/1997 | Miki et al. | 398/100 |
| 5,713,074 A * | 1/1998 | Hulbert | 455/69 |
| 5,751,149 A * | 5/1998 | Oberg et al. | 324/533 |
| 6,005,891 A * | 12/1999 | Chadwick et al. | 375/224 |
| 6,662,135 B1 * | 12/2003 | Burns et al. | 702/120 |

* cited by examiner

*Primary Examiner*—Mohammad Ghayour
*Assistant Examiner*—Lawrence Williams
(74) *Attorney, Agent, or Firm*—Foley & Lardner LLP

(57) ABSTRACT

Signalling between transmitting means and receiving means wherein signals from the transmitting means are subjected by the receiving means to deliberate reflections and resulting signals are transmitted back as meaningful at the transmitting means, different deliberate reflections having effects on said resulting signals that have different meanings at said transmitting means. Two-way signalling involves first signalling in one direction by sending signals with certainty of deliberate reflection thus resulting signals for return related to the signals sent according to the nature of the deliberate reflection and second signalling in the other direction by varying the nature of the deliberate reflection.

51 Claims, 20 Drawing Sheets

IMPEDANCE MODULATION SIGNALING

This application is a continuation of International application No. PCT/GB99/00008, filed Jan. 11, 1999.

FIELD OF THE INVENTION

This invention relates to signalling and has arisen in relation to electrical high speed digital communication but is not limited to such application.

BACKGROUND TO THE INVENTION

Increasingly, very large amounts of data need to be sent quickly and reliably, whether between equipments over interconnection networks or within equipments/installations of a basically data processing nature, such as computers internally and/or relative to associated units. Massive resources have been devoted to speed and reliability of transmission and reception, including formats of signals and signalling protocols to facilitate such communication using electrical and optical transmission lines, e.g. coaxial and twisted pair copper-based and/or fibre optic cabling. Transmission lines are susceptible to signal reflections unless terminations afford a perfect impedance match, and impedance is affected by lengths as well as types of transmission lines involved. Hitherto, signal reflections have been seen as a profound problem seriously affecting fidelity of signal transmission and reception, and justifying great efforts to control them.

SUMMARY OF THE INVENTION

According to a first aspect of this invention signalling is based on deliberate production and use of reflections of transmitted signals.

This represents a radical departure from the past. Signal reflections are automatic, and deliberate reflections are used herein for signalling as such, including inherently for two-way duplex signalling. There is also highly advantageous further use for control/checking etc purposes with great potential impact on reliability as well as simplification.

Two-way signalling as described herein involves first signalling in one-direction by sending signals with a certainty of deliberate reflection which results in return signals related to the signals sent according to the nature of the deliberate reflection, and second signalling in the other direction (i.e., the return signals) by varying the nature of the deliberate reflection.

The source of the first signalling will assess what is received back corresponding to what was sent and determine the nature of the deliberate reflection thus the signalling content. The source of the second signalling needs only to detect what was sent on the first signalling and vary the nature of the deliberate reflection according to the second signalling.

Basic requirement for binary data communication becomes only for distinguishing between what is reflected for the two binary values ('0' and '1'). For the source of the first signalling, the binary value signals will have different voltage excursions suited to being assessed as aforesaid. For the source of the second signalling there could be high deliberate reflection for one binary value compared with low for the other binary value, even intendedly near none—but in practice likely some inherent reflection, i.e. effectively accepting reasonable levels of what much prior effort has gone into trying to eliminate or take to lowest attainable level; indeed, deliberately ensuring much higher levels for signalling purposes. Moreover, actual reflection signals are readily dealt with after it has happened and been received, particularly as part of control/checking etc use made of it.

This leads to preference for signal formats for the first signalling having successively oppositely-directed voltage excursions for each binary value, say with different phase relation to distinguish the two binary values, conveniently anti-phase relation. If the successively oppositely directed voltage excursions for each binary value are of different polarities, and for which the term "bipolar" is used herein, at least reduction of DC signalling component results, down to nominally zero, in practice minimal (subject to transmission path effects) if nominally for the same shape of such excursions.

Specific implementations of signalling hereof involve different signal levels applicable to three phases of bit signals of the first signalling, specifically to extents of excursions and also another level typically between them, preferably to mid-way; conveniently similar opposite polarities and zero for bipolar bit pulses. Advantageously, the bit signal phase with typical mid-way level is a low impedance voltage state rather than the high impedance 'off' state customary for well-known tri-state logic gating.

A second aspect of invention resides in signalling format including prescribed intervals free of actual information signal content, such intervals being sufficient to allow control/checking etc functions to be done, particularly as to signal quality. A nominally substantially constant voltage may apply in such intervals, typically medial of said excursions, conveniently zero and of low impedance nature at least for bipolar bit signals.

At least for bit signals of said first signalling, such intervals can be part of individual signal format for each binary value, say higher excursion of one polarity followed by excursion of opposite polarity and further followed by no excursion; or could be after bursts of bit signals at least where, as is usual, signals in both directions do not interfere, say a number of successive bipolar excursion followed by no excursion.

At least for said second signalling, particular advantage is available for binary value signals if deliberate reflection is by termination means affording extremes of impedance mis-matching, namely open-circuit and short-circuit conditions; and automatically applying one as one bit value signal and the other as the other bit value signal. Specific description will follow of open-circuit termination applied to successively bipolar signals having anti-phase relation to bit values, and voltage value of either bit signal raised up to normally doubled by open-circuit termination and reduced down to normally near cancelled by short-circuit termination. These relationships enable the sources of the first signalling to interpret its received signals as to binary value of the second signal according to which of open-circuit and short-circuit reflections were applied for reflection, say open-circuit for binary value '1' and short-circuit for binary value '0'.

Received signals after reflection actually can indicate correct remote reception of first originally transmitted signals as well as have second signalling binary value readily detected, the correct differences from what was sent being up to voltage doubling and of same shape or down to voltage cancelling.

Moreover, correctness and quality of signalling in both directions are inherently represented by the round-trip nature of the signals after reflection, thus suited to checking only at the source of first signalling. Quality can be investigated to any desired degree or extent albeit only sensibly within the limits of normal transmission characteristics of the connection concerned. This is readily done relative to matching expectations for reflected signals and/or as to shape as such relative to first signalling format, say involving extraction of difference due to reflection as such plus noise. Waveshapes can be thoroughly investigated for total excursion. Checking provisions could, however, be much simpler, including down to reliance on presence detection with any desired thresholding to identify bit values of reflected signals, and checking their sequencing relative to what was transmitted, feasibly without checking of actual timing.

Particularly advantageously, the above successively opposite-going signal formats, permit checking with the availability of double-checking for successively opposite-going nature of signals contents, say as extracted using hybrid means. It is extremely unlikely that a noise signal would do this, at least with spacing close enough to confuse relative to the signal format concerned, as can be checked simply using prescribed delay provisions. A simple suitable protocol involves detecting direction of each excursion, preferably as polarity whether directly or as converted from any other reference level, say by exceeding of pre-set excursions threshold preferably above expected spurious signal levels, as part-confirmation; and occurrence of opposite excursion within a predetermined time interval as likewise further part-confirmation.

Useful refinements include checking symmetrical similarity of the opposite excursions quantitatively, say using integration of each excursion and deriving difference with checking that it is not too high, which can be done conveniently using two integration input stages to a differential amplifier with a thresholded output. Other useful refinement includes checking for a minimum time free of bit signal preceding and/or succeeding each first or last detected excursion; which should at least exceed said control/checking interval. A log response can assists relative to possibly wide ranging relieved signal strengths, say using diode clamping.

Also, it is practical to provide for adjustment of threshold values involved, say to cope with possibly wide ranges of round-trip signal paths; and/or control/checking response times also involved. This can be done using outputs of digital-to-analog converting means that could be, or further be, subject to software control in a topical programmable computer controlled equipment.

At least in these circumstances, it is viable in at least some applications, for complex and expensive timing provisions to be dispensed with virtually altogether. Thus timing provisions could essentially be limited to assessing the first transmitted bit signal (or first group if preferred) say free of second signalling modulation but with a particular termination with corresponding received reflection signals. Such timing would then be variable at will by the transmission equipment, including changing rate within an information bit stream, even from bit to bit; or, and particularly advantageously, for increasing transmission rate to what the preset transmission path will reliably custom, conveniently using an appropriate initial sequence of bits to speed up to failure, then reduce the rate for subsequent information transmission.

These checking and timing features are seen as constituting third and fourth inventive aspects hereof, respectively, whether in generalised or more specific terms.

The above inventive aspects lead to systems with high degrees of virtual internal self-regulation free of at least some of complexities besetting many prior systems in terms of dealing with signal reflections, error detection whether or not extending to correction, distribution of high speed clock timing signals, and making provisions to compensate for attenuation through long runs of transmission line cabling.

In turn, this success by simplification has led to considering another communications system problem, namely addressing provisions so that only target equipment(s) are activated to receive intended transmissions. This is generally achieved by address codes for each equipment concerned and consequent address storing, recognition and transmission provisions being required at each equipment concerned, at least for so-called "ring" or "daisy-chain" systems with each equipment coupled to a side of a common transmission line. Indeed, such ring/daisy-chain systems nowadays attract disapproval in favour of so-called "star" systems that tend to be much less flexible and more expensive, at least for addition of further equipments. The reasons are, of course, closely related to above indicated complexities of very high speed communications systems.

According to a fifth aspect of this invention, routing provisions rely on sending out non-address type signals that nonetheless serve to establish desired connections between transmitting and receiving equipments over communication provisions with significant commonality of transmission paths, suitable routing means relying on values of a series/sequence of transmitted routing bit signals and response to each routing bit signal by individual nodes of a common transmission path, according to state-setting means of each node.

The nodes may each constitute control of entry to a different one of equipments involved (in fact only so for true ring or daisy-chain systems) or to a branch communication path or spur to other equipments. The routing bit signals can be seen as instructions representing do or don't accept and activate directly associated equipments or do or don't branch to another communication path/spur.

Suitable routing signals comprise a series of single-bit signals one for each node to be encountered up to the target node with each bit eliminated or absorbed at the node which it instructs according to the sequence of value, of the series of single-bit signals. Complex branching and sub-branching retracks can be negotiated in this way. Any confirmation protocols involving transmission back of an identifier from the equipment reached; may appear to have some equivalence prior to addressing—but processing related to recognition in a so-called master-and-slaves system need only be at the master equipment.

It is further the case and a sixth aspect of this invention that continuous conducting paths established for communications purposes, along with intentionally non-DC nature of bipolar signalling, allow DC or low frequency AC power to be applied anywhere and passed anywhere in the network concerned.

BRIEF DESCRIPTION OF DRAWINGS

Specific exemplary implementation of this invention will now be described with reference to the accompanying diagrammatic drawings, in which FIGS. 1A, B show in-principle transmission line reflection effects for open-circuit and short-circuit terminations.

Figure 1:
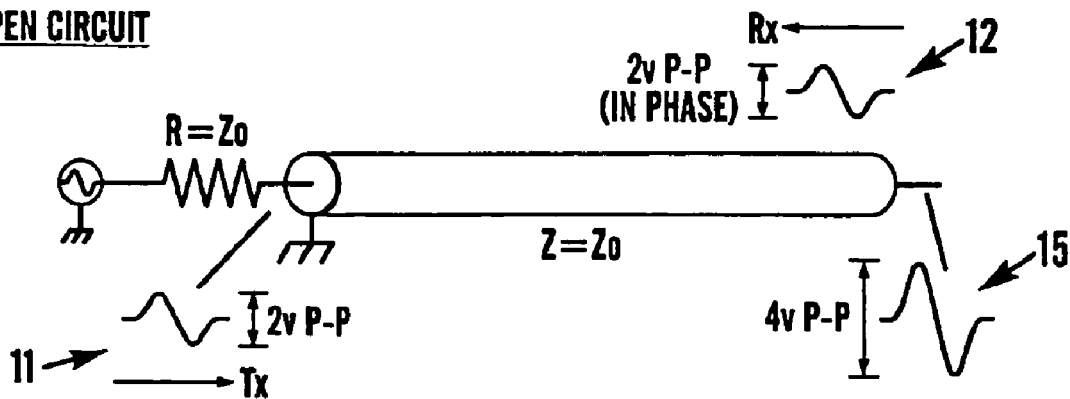
Figure 1:
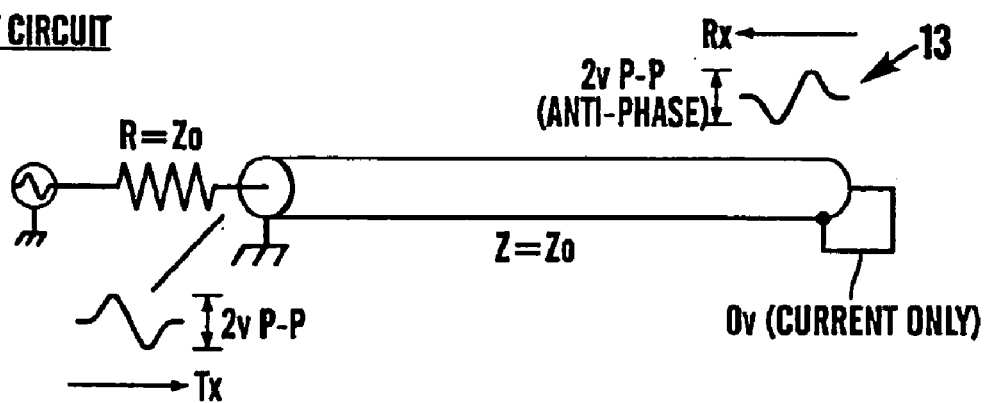

In the drawings, the idealised waveforms of FIGS. 1A and B show a symmetrical-about-zero sinusoidal bipolar signal (11) as affected by open-circuit or short-circuit terminations to produce in-phase (12) and anti-phase (13) reflected signals resulting in transmission line reflection affected signals with voltage respectively doubled (15 in FIG. 1A) or cancelled (FIG. 1B), specifically shown as 2-volts peak-to-peak as transmitted and 4-volts peak-to-peak or zero volts as reflection signals.

Figure 2:
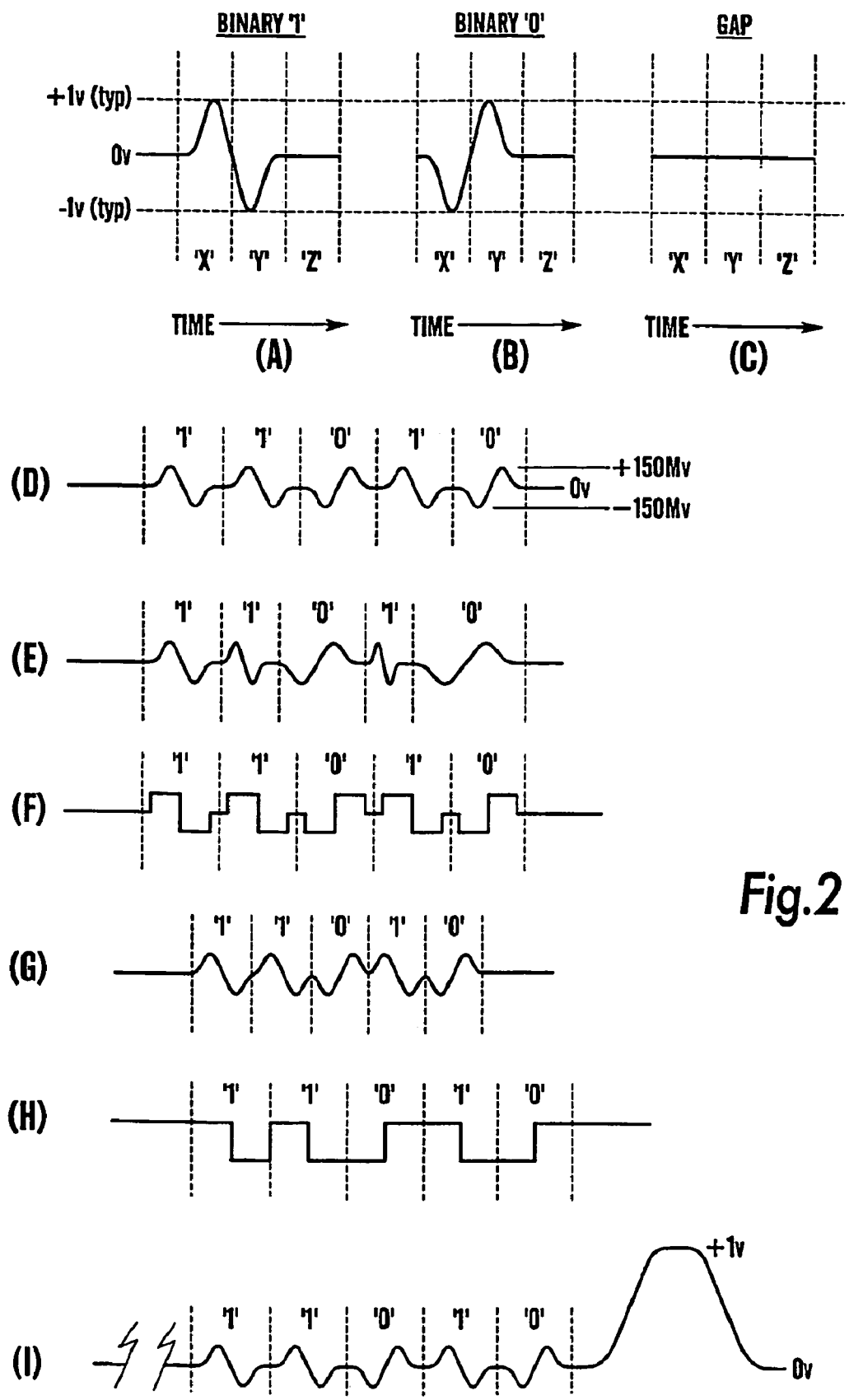
FIGS. 2A, B shows idealised waveforms for a bipolar bit signal format.
FIG. 2C shows another bit-length signal.
FIGS. 2D-I show multi-bit like and alternative formats.

FIGS. 2A, B show a preferred signal format for implementing this invention. This signal format involves successive opposite-going excursions at X, Y for each of the binary values for signalling hereof in one direction, specifically positive first (FIG. 2A) and negative first (FIG. 2B) for binary '1' and '2', respectively, in respect of bipolar or symmetrical-about-zero sinusoidal waveforms. FIGS. 2A, B further show at Z a medial level voltage component following each bipolar component X, Y—specifically mid-way voltage at zero and advantageously of a low impedance nature as produced for use herein.

Signalling in the other direction is according to which of open-circuit and short-circuit terminations are applied, specifically binary '1' and '0' respectively, as described relative to the drawings.

The inherent purity and smoothness of sinusoidal waveforms is preferred, but other signal formats could be used with opposite going wave-form shapes, e.g. trapezoidal, triangular, rectangular or variously curved rises and/or peaks and/or returns. The medial voltage component (Z) could be anything else readily distinguishable from the combined X, Y opposite—excursion components, say if desired to be additionally meaningful; and might be utilised as herein for low impedance zero with any such variation therefrom effectively removed, say for its desired meaningful purpose.

Figure 3:
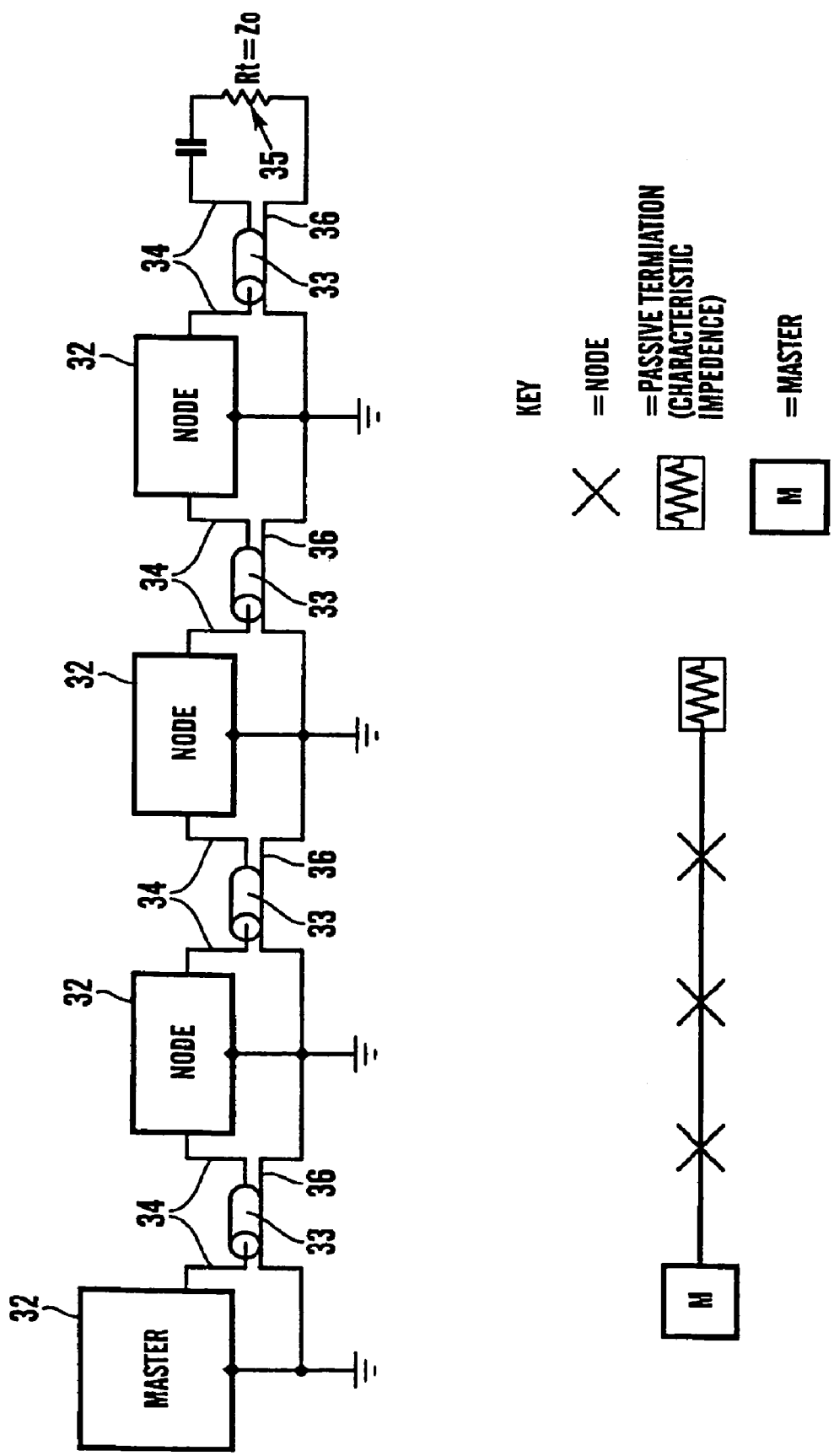
FIG. 3 indicates outline of a simple master-and-slave interconnection network.

Application will be considered first in terms daisy-chain interconnection systems of master-and-slave type, see FIG. 3 for master equipment 31 and nodes 32 of or associated with slave equipments shown interconnected daisy-chain style between master 31 and passive absorptive termination 35, by transmission line parts 33, specifically shown as coaxial cable with signal-carrying central conductors 34 into and out of the master and nodes and outer earth shielding connected together.

Figure 4:
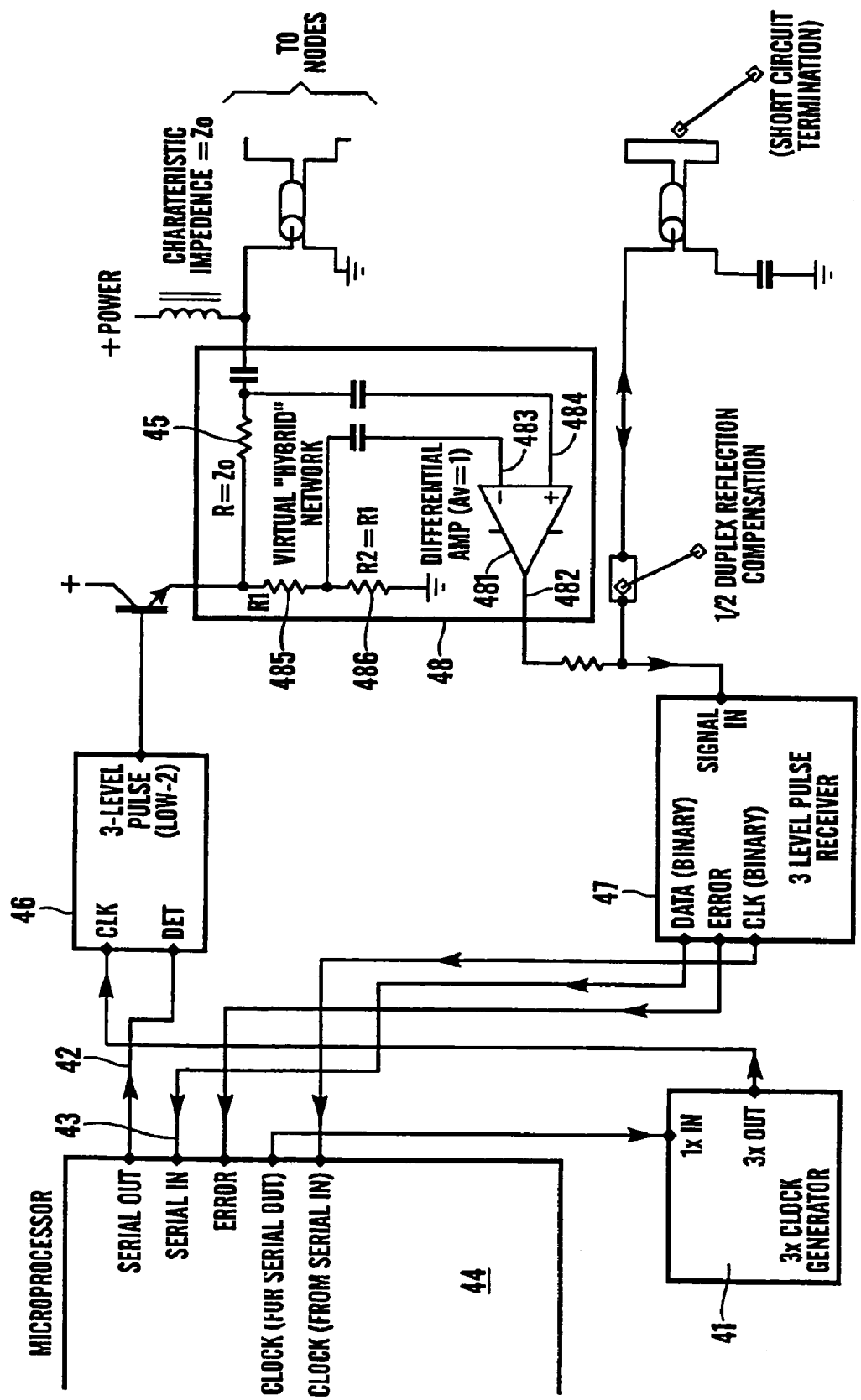
FIG. 4 is a mostly block schematic outlining a master equipment.

Turning to FIG. 4, the master equipment 11 comprises a preferably programmable clock source 41 operative at three times intended bit rate, serial data output 42 and input 43 shown afforded by microprocessor 44, output terminating resistor 45 matching characteristic impedance of the transmission line (which need not be coaxial cable), three-level output data pulse generator 46, input receiver 47 with pulse quality checking provision, and virtual hybrid network 48. Electronic circuitry suitable for the illustrated blocks can be implemented with conventional integrated circuit technology.

The virtual hybrid network serves a similar purpose to transformer hybrid couplers in early telephony, i.e., 4-wire to 2-wire conversion, specifically herein to separate first signalling as transmitted by the master from second signalling by the reflection signals coming back to the master 11 according to deliberate reflection action at the nodes. In addition, associated differential amplifier 481 will have output 482 corresponding to difference in voltage between its inputs 483 and 484. Resistors 485 and 486 have the same value as resistor 45 which matches the transmission line impedance, and will result in the same 2:1 divider action at differential amplifier inputs 483, 484. In absence of any reflection signals, the differential amplifier 481 would have inputs of equal voltage and phase, thus give zero output. However, whatever reflection signal component arrives back at the master from the transmission line will increase or decrease voltage on the line 484 compared with the voltage on the line 483 from between the resistors 485, 486 and output 482 from the differential amplifier 481 will show the difference. In principle, i.e., other than for noise etc, differential amplifier output 482 tracks the reflection components, the transmitted output signal having effectively been removed.

Figure 4A:
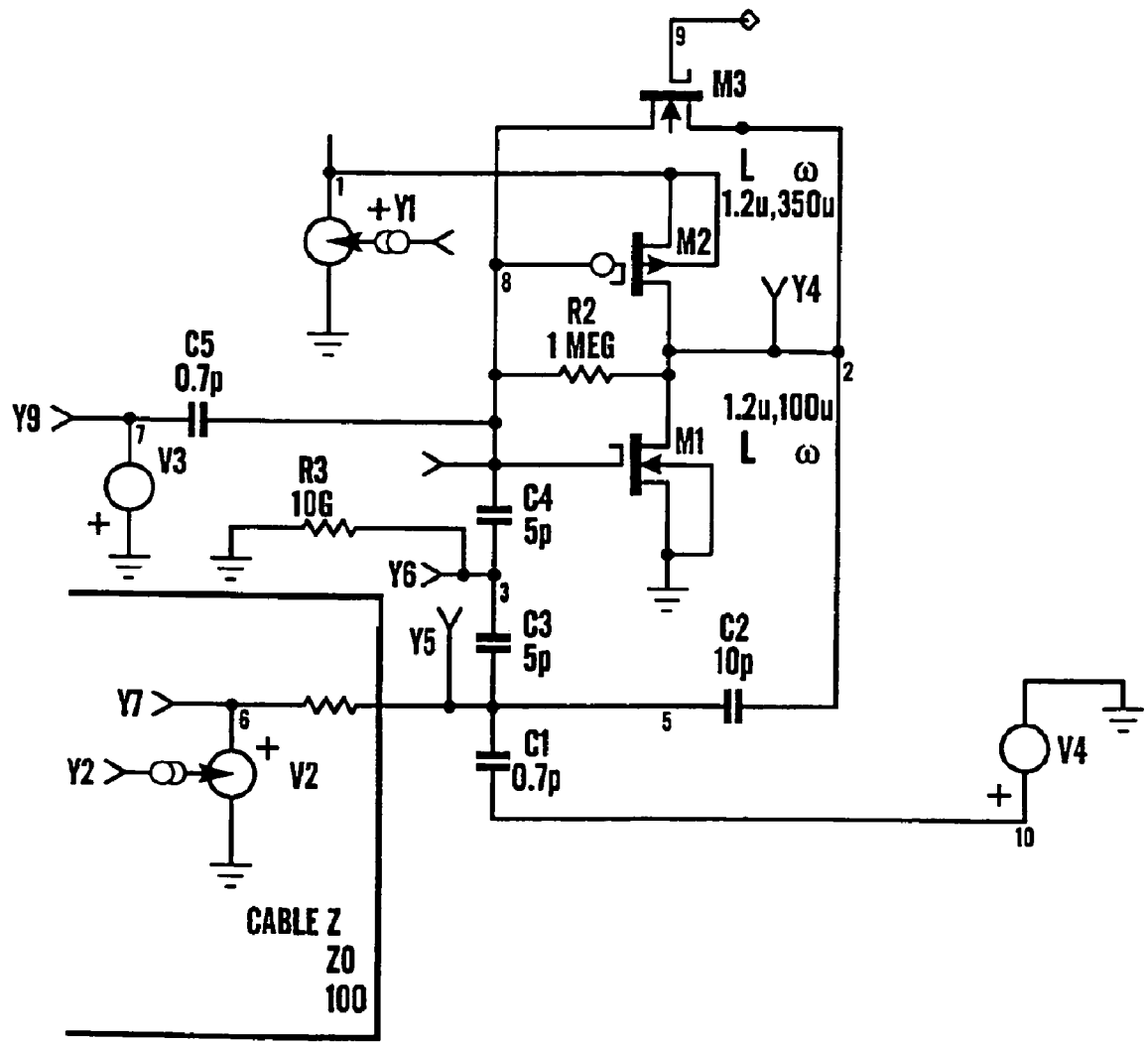
FIG. 4A shows alternative circuitry.

An alternative for function performed involving the hybrid 48 is shown in FIG. 4A and is suitable for IC production.

It does no other processing, but works in a continuous manner, for outgoing and incoming bit signals present on the transmission line at the same time, there being nominally no magnitude and phase difference between outgoing and incoming bit signals and substantially no mutual interference.

The circuit has two large transistors M1 (N-type) and M2 (P-type). M2 is scaled in width relative to M1 to compensate for the lower transconductance of P type devices. M1 and M2 have equal transconductances. The combined transconductance is approximately equal to 1/Zo, i.e reciprocal of transmission line characteristic impedance. Capacitors C2 and C3/C4 pair make the circuit appear as a real resistor of Zo ohm looking into Y5 to give proper transmission line terminations, as input-output 100% feedback inverting transconductor and a resistor of 1/gM total are equivalent.

This circuit serves for termination of incoming waves and preventing reflection from master end—although in principle the energy could be re-used launching outgoing master wave sequences towards nodes as the source of all signalling waves extracting incoming signal, in this cases, reflected free of any launched signals.

Specifically, Y7 represents 'Phantom signal' source of the reflected bit signal energy from a node as it arrives back at the master; Y9 is signal input (simplex) to launch into the cable from master; Y6 is where returning signal recovered, preferably to be fed to an integrating receiver circuit; Gain seen from Y3 to Y5 is −1 so Y6 kept from moving with outgoing signals. Y5 is input-output port (for voltage such as at centre-conductor of coaxial cable or microstrip etc transmission line; Zo represents source impedance of the transmission line (i.e. is not a real resistor); C1 and V4 (inverse of .Y9) can be used if necessary to minimise signal injection into the transmission line; R2, R3 help initial conditions of simulation and are not used in practice; M3 is a reset transistor which is activated whenever the master is outputting a gap period (inter-bit or inter-burst gaps), and helps to restore the self-bias operating point of the circuit while still terminating at characteristic impedance and lets the coupling capacitors adapt to any small DC voltage imposed on the cable by DC supply currents.

Y4 is internal node that slews as C2 gets charged/discharged large C2 means less slewing on Y4; Also, C2 can be small but Y4 should not slew enough to saturate; Y7, R1 represent a 100 ohm source; V4/C1 accepts current from V3, C5; C3, C4 and C5, C1 might be lowered proportionally.

And, capacitive divider action (e.g. gate capacitances) acts to reduce feedback around inverter thus lowers transconductance and increases effective resistance, which can be compensated by designing for over-transconductance; changing the attenuation between output port and gate can be used to match to different transmission line impedences under software control; using opposite signal to inject directly at input-output (I/O) node compensates for errors due to capacitive signal currents into I/O node (avoids this path), but at the expense of higher I/O capacitance; opposite signals can be generated from inverters in the ring.

Bit signals used are short symmetrical pulses followed by a zero voltage interval, see X, Y, Z in FIGS. 2A, B. They have no DC component and allow for entirely AC coupling throughout. The interval Z allows time to interpret the pulse components (X, Y). FIG. 2D shows a bit sequence using these bit signals (X, Y, z), and FIG. 2F the same but using a square wave format. FIGS. 2G, H show application without intervals for groups/bursts of bit signals but with intervals to each side, for sine and square wave forms. The gap signal of FIG. 2C is of the same length as a bit signal, but at zero volts throughout; and is used for various control purposes involving strobe and reset as below. FIG. 2I shows a bit-by-bit interval signal of sinusoidal shape with a large excursion pulse to serve as an end-route indicator, see later regarding routers, and/or for such other purposes as may be desired, including resetting or deliberately breaking neutrality.

Figure 5:
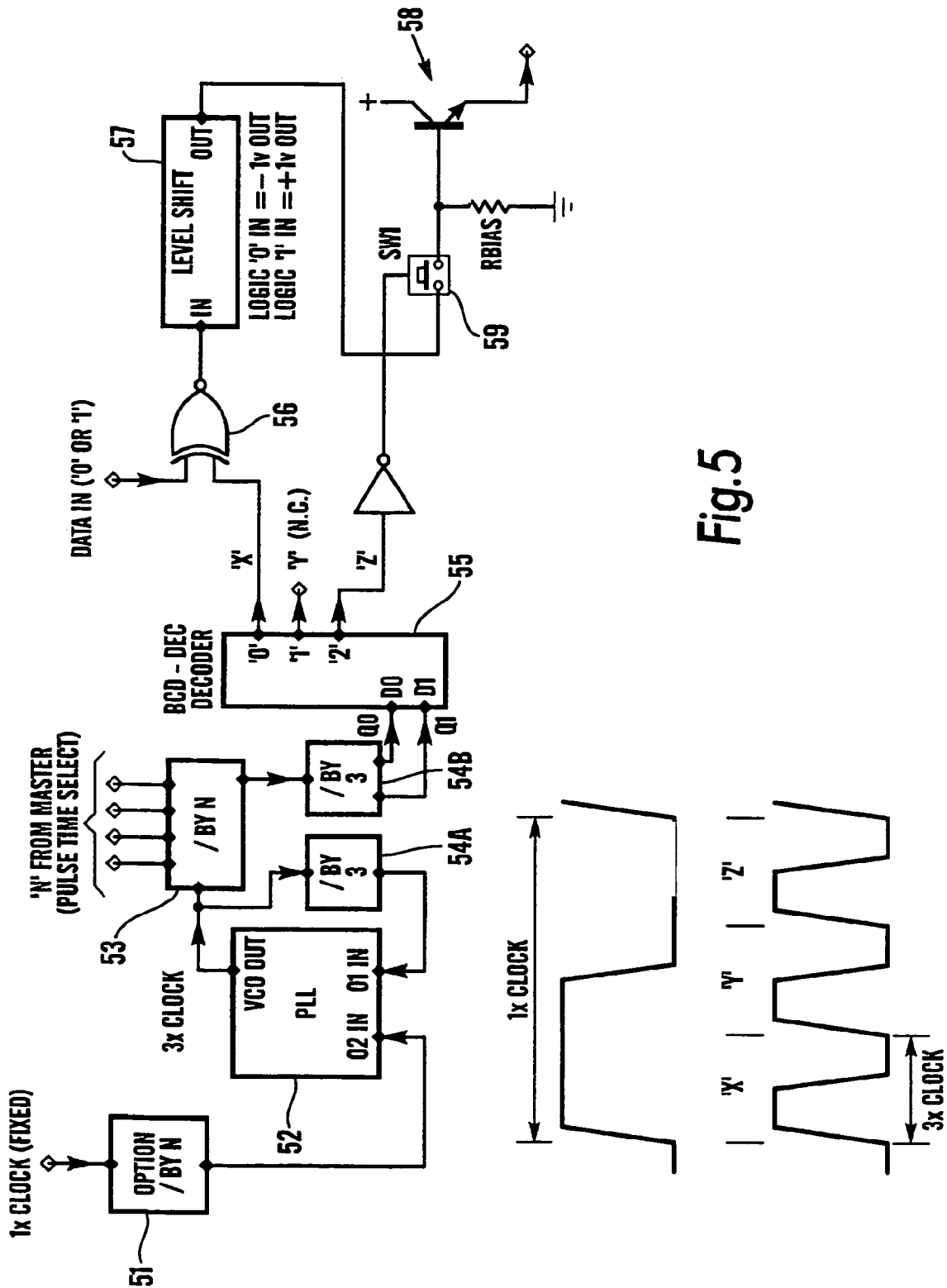
FIG. 5 is a block circuit diagram for data pulse generation for three-level signaling of FIG. 4.

FIG. 5 shows three-level output data purse generation for preferred three-level signalling, see fixed clock 51, phase-lock loop 52, selective divider 53, specific divide-by-3 dividers 54A to the phase lock loop 52 and 54B to bit signal format time setting 55, coincidence gate 56 for coordinating bit excursions (X,Y) with input binary data values and controlling production at 57 of positive and negative voltages applied to biased base of output transistor 58 through switch 59 controlled by output from time setting 55 to be turned off during the interval (Z) following the bit value representing bipolar excursions (X,Y).

Varying the selective divider 13 enables changing of the bit signalling rate, say to suit practical maximum for the nodes and transmission line(s) of any particular installation, or even specific connection. Such changes can even be on a bit-by-bit basis, see FIG. 2E, but are usually on a one-time or periodic system configuration or re-configuration basis. To set such bit rates, the microprocessor 44 is programmed to send at prescribed increasing bit rates until the reflection signals first fail quality testing, then send below that rate as a stored pre-set. In principle, this could be applied to each communication each time it is set up and stored by the microprocessor 44.

Three-level signalling may be inherently less fast than using NRZ (non-return-to-zero) binary code, but has advantages of symmetry and ease of decoding and error checking. Three-level digital systems in use in telephony do not have wave-shape and encoding hereof, such as symmetry with time and amplitude. Also, the third-state hereof is of low-impedance voltage nature mid-way between the '0' and the '1' levels not a high impedance "off" state as Tri-State™ logic gates used for bus isolation. Most of other digital circuitry hereof operates on conventional two-level binary logic basis.

The third state applies to the interval (Z) and also to the gap of FIG. 2C free of data signal as such, which can be used in control of various aspects of operation, including addressing preferably by routing to be described. This interval can be generated by master or slave depending on which is active at a particular time.

Figure 6:
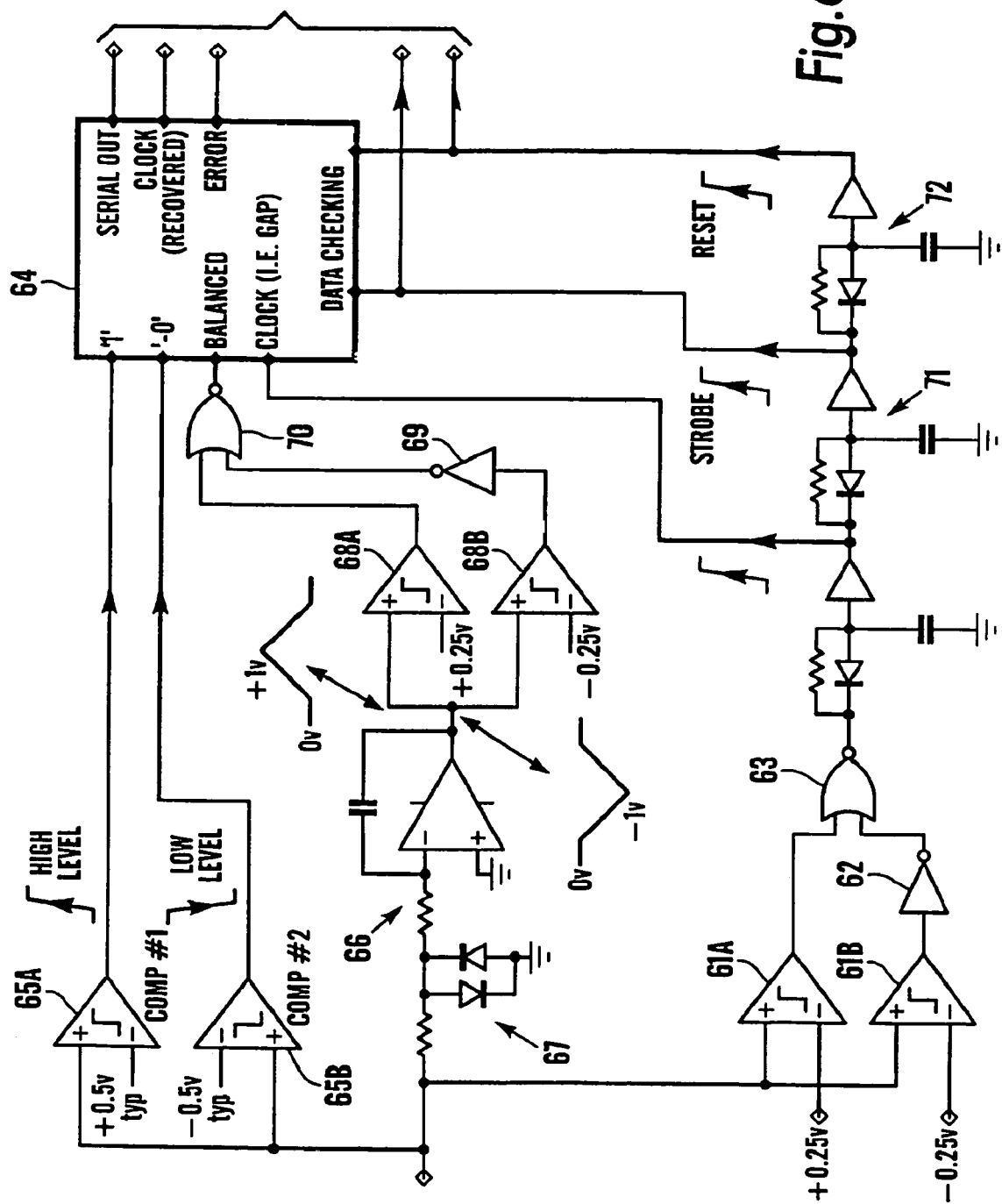
FIG. 6 is a block circuit diagram for three-level signal receiving and check provision of FIG. 4.

FIG. 6 shows three-level signal receiving and quality checking provisions for anything from the transmission line. This system can detect errors in each single bit of data transferred with very good dependability, whether for reflections as such or for data signals originating with a slave equipment/node and signalled according to reflection type. It should be appreciated that all signals hereof, including reflections, have at least nominally, the same bipolar/plus interval format as true bit signals; and can be investigated as outputs from the differential amplifier 481 associated with the virtual hybrid 48 of FIG. 4.

For received bit signals to be accepted as representing binary values '0' or '1', the following checks/tests of its wave-form are made.

1. Each received bit signal waveform must be preceded by a gap of at least that between bipolar excursions, see positive and negative threshold detecting differential amplifiers 61A, B (which may conveniently be set at about one-quarter of each nominal peak), inverter 62 and NOR-gate 63 to give positive output whenever both of the outputs of differential amplifiers 61A, B are low corresponding to the received signal being within, i.e. not exceeding, the thresholds concerned as will apply throughout the interval Z and can be counted in data checker 64. This will detect framing errors and general noise on the lines preventing a stable zero reference.

The same state of the NOR gate 63 will, of course, apply for a short time while the waveform traverses between the thresholds as its polarity inverts and the corresponding shorter pulse can also be used by the data checker 64, at least in connection with checking for inversion, and say in conjunction with the next test.

2. Each waveform should go sufficiently towards each positive and each negative peak—in one order or the other depending and within a minimum time—to believe it is a bit signal, see threshold detecting differential amplifiers 65A, B (which can be set higher than for 61A, B—say at about half of each nominal peak) shown as sending correspondingly positive and negative outputs to the data checker 64. This check indicates a bit value directly (not necessarily signalled bit value which needs interpretation in data-checker 64), and enables counting by the data-checker 64 in respect of said minimum time, and with due account taken of the short pulse from the NOR gate 63.

This check together with results of the above check, say if indicating interval free of bit signal, can allow picking up weak signals with levels between the thresholds for 61A B and 65A, B.

3. Each waveform must go on to invert and exceed the opposite threshold within a time period set by the master unit. These are dealt with above and prevent any glitch(es) of noise from being interpreted as data since it is very unlikely that noise could be first one polarity then the other with transition near mid-way through during the sampling period, i.e. without it being of very similar frequency and double amplitude so as to mimic or cancel any valid signal.

4. When the long pulse from the first above test is next again detected after finding the two polarities of pulse components and inversion as mentioned above, a further test is made of the integrated total of positive and negative currents for balance within a fixed percentage, see integrator 66 with log clamp 67 at input and threshold controlled differential amplifiers 68A, B in conjunction with inverter 69 and NOR-gate 70 to data checker 64. The op-amp integrator 66 could be replaced by a transistor with capacitive collector-base feedback.

This check verifies the symmetry of the waveform. Any on-balance unipolar noise pulse occurring during the sample time would leave the integrator with a corresponding non-zero output, whereas any reflection of the symmetrical bipolar component of the bit signal format hereof should closer to zero amount of imbalance even for a wide range of returned signal strengths.

The interval (Z) period should persist for a given time before previous data is accepted, as can be counted in data checker 64. This will detect noise in the interval time.

The above tests give an error if the received signal is too weak and/or for common mode noise voltage.

Instead of fixed threshold levels as shown, it may be advantageous to employ DAC converters to allow adjustment, particularly by software, to facilitate communication for a wide range of round-trip signal attenuation levels. It is also possible to use DAC adjustable response time control of the receive comparators and amplifiers to aid rejecting HF noise if operating at low data rates, say for reliable communication with more distant nodes, as can be achieved by setting of the bias currents in these components (larger currents generally giving faster response with fixed parasitic or added capacitances).

Strobe and reset signals are generated within length of the gap signal of FIG. 2C, say strobe in the time Y and reset in the time Z, see delayed pulse generators 71 and 72 in FIG. 6, which also shows a fixed delay on output of the NOR gate 163. The comparators 61A,B enable monitoring by the data checker 64 that all interval components (Z) and gap signals (FIG. 2C) are within a given range of zero volts, as set by their thresholds.

Slave nodes 32 reflect signals from the master 31 on a bit by bit basis and on an open-circuit or short-circuit basis depending on bit signal values to be signalled back to the master 31. These reflections are also effective acknowledgements of reception by a node 32 on a bit-by-bit basis.

Figure 6A:
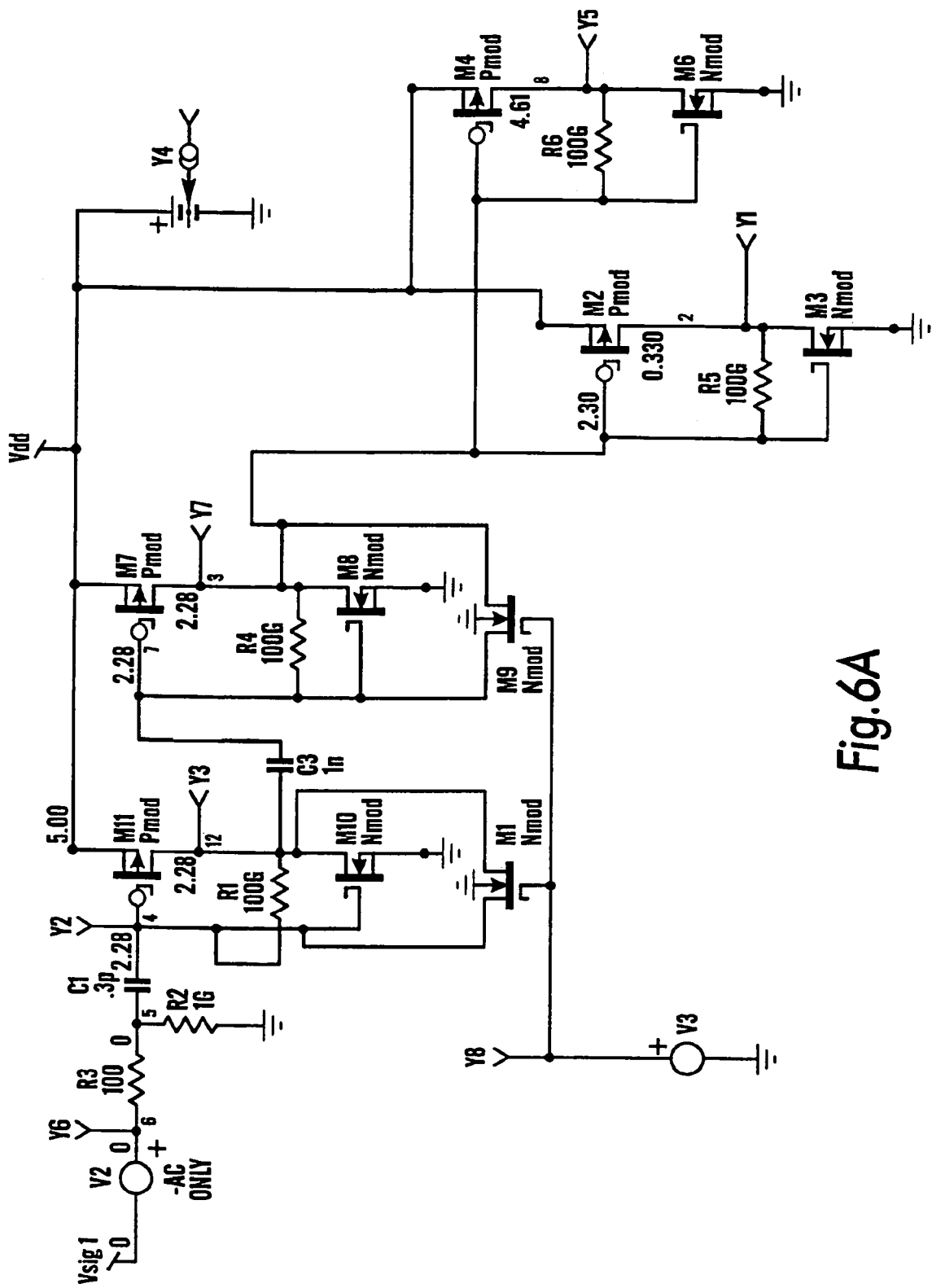
FIG. 6A shows alternative receive circuitry.

An alternative receive circuit is shown in FIG. 6A, particularly aiding integrated circuit implementation.

This circuit differs from FIG. 6, and is based on the integral of the bit signal waveform format is the actual binary value, and that an amplifier that is 'not-fast-enough' produces an integrating response. In FIG. 6A:

Periodic auto-zero-reset of AC amplifiers and integrator overcomes drift, transistor noise, power supply noise expected inside a typical digital CMOS process of small transistor size, as optimised for digital speed. With signalling hereof, inter-bit resets are possible which significantly eases the requirements from drift/noise.

Each time the reset transistors are activated, amplifiers take up their self-bias voltage and the integrator will be discharged, which has no implications as activated only in gap times and for a short period transistor channel lengths can be fairly long to give good gain.

The same circuit can be used for both node (to get master data directly) and master end (after FIG. 4A circuit), bearing in mind that the data this recovers needs interpretation at master.

In operation, M11, M10 acts as a transconductance stage (i.e. Voltage→Current) stage. The input voltage datastream waveform Y6 modulates the gates of M11 and M10. On positive signals above the self-bias point, the Nch transistor conducts more, while the Pch conducts less. —The output point Y3 can then sink current. Conversely, on negative polarity signals relative to the self-bias point, Pch transistor conducts more, and Nch conducts less so can output source current. At the self-bias point, M11 and M10 currents are the same, so no net current available at Y3. Y3 feeds a low impedance point as input to integrator, and the voltage at Y3 changes very little (+/−90 mV), so there is highly integrating effect and the parasitic feedback capacitances do not come into play. M7 and M8 act as Integrator. In contrast to M11, M10 the output voltage here at Y7 is allowed to slew. No feedback capacitor is shown; nor is needed to implement the integration function because the parasitic Drain→Gate capacitance provides this at low signal swings. The signal at Y7 is approximately the integral of the input. For example for the first '1' bit signal wave coming in, Y7 integrates positively while the input wave is positive. At zero-crossing of the input wave, Y7 is at its peak. During the second (negative) half of the bit signal wave, Y7 integrates downwards. The total area under the positive half of the wave will equal that of the negative half of the wave for end of the bit signal time to be return to the self-bias point. At higher Y7 signal swings, as for slow rate input data, the output at Y7 can swing towards either one of the supply rails. When this happens, the mosfet connected to that supply rail goes from saturation with drain end pinched off to ohmic with drain end connected ohmically to source. When this occurs the Drain→Gate capacitive feedback increases to be the full Gate oxide capacitance. This effect is very useful because it makes for an integrator with high swing, good sensitivity but a very large charge ultimate charge capacity, making the circuit useful to integrate over a 10:1 time range. Due to charge conservation, all charge stored on the mosfet must be removed. Only when all charge stored during one polarity of the input waveform is removed does can Y7 go back to mid-point—just what is required with balanced input signals. Digital extraction of the waveform at Y7 is done with M2/M3 to detect 0's and with M4/M6 to detect '1's (output pulse sense being inverted). Thresholds are set by the relative channel widths of transistors M2 and M4 relative to those of M7, M11. M2 is narrow to give the inverter a lower-than-normal threshold, M4 is wide to give that inverter a higher-than-normal threshold. Normal logic gates can convert the two signals into DATA and CLOCK (clock occurring in the Gap time) to drive a shift register. Another shift register clocked by same clock can sequence the Node→Master data which controls the reflector (data to master) to the master and this makes incoming and outgoing data syncronous and correctly ordered.

Figure 7:
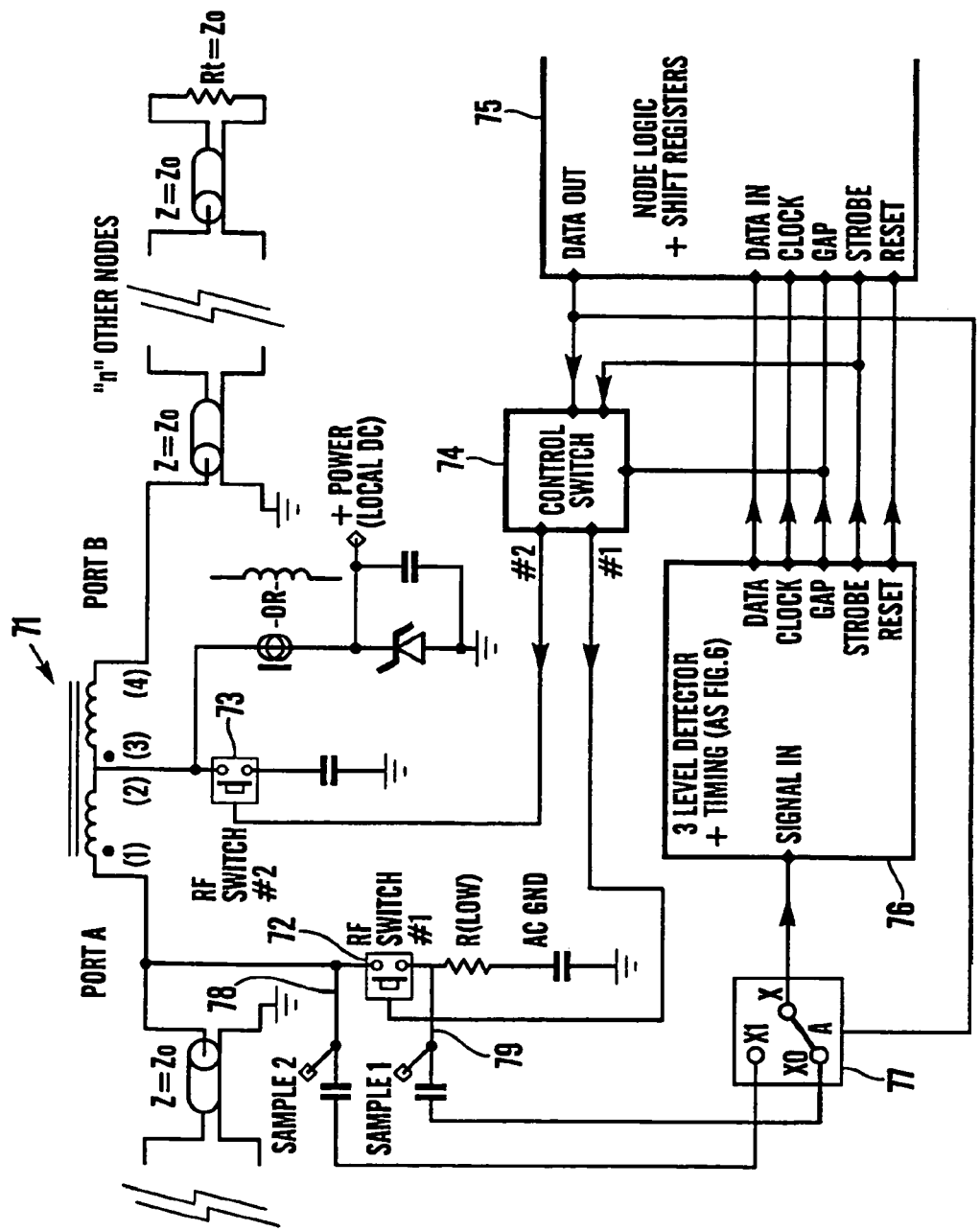
FIG. 7 is a schematic circuit diagram for node provision using a broadband transmission line transformer.

FIG. 7 shows one slave node equipment using a wideband pulse transformer 71, shown connected between centre conductors of coaxial cable with input side and centre-tap switches 72 and 73 for data-in/-out according to switch control 74 from node control logic and shift register provision 75 similar to FIG. 6 but typically simplified by not requiring quality checking, and also shown receiving timing control outputs from three-level detection and timing provision 76. Reflection termination control is according to data modulation switch 71 connected to sample points 78, 79 shown to each side of the data-out switch 72. Suitable construction of the transformer 71 is as an inverting transmission line transformer made from either coaxial or twisted pair cable wound around a high permeability toroid core, see FIG. 8. An alternative is to fabricate a microstrip transmission line transformer as a printed circuit board and use planar magnetic cores to magnetically link the circuits, see FIG. 9.

Figure 7A:
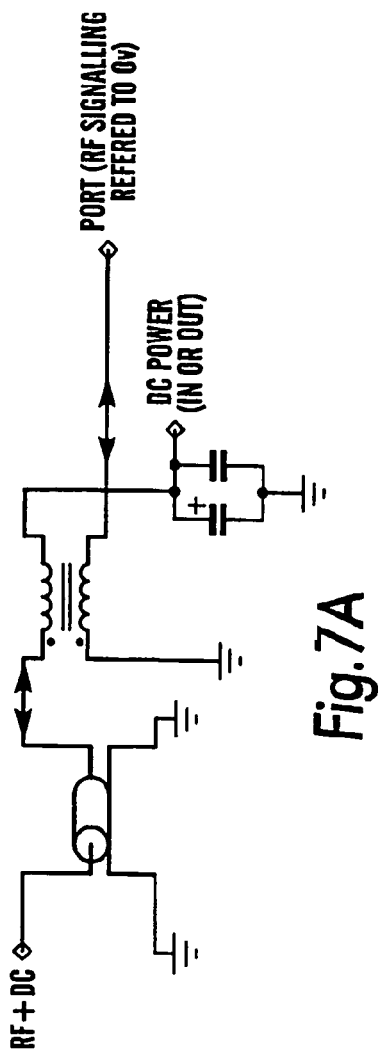
FIG. 7A shows an alternative.

FIG. 7A shows an alternative transmission-line transducer, in which:

signals riding on large DC or AC power voltages can be brought down to 0 v referred levels compatible with IC signal processing. Bidirectionality means that a 0 v referred signal e.g. Master waveforms) can also be put up onto the DC power level. Power can be made available for local node. All routing/reflecting is now done at 0 v with IC Nch transistors. The transmission line transformer can be a simple hollow ferrite bead at UHF. The same circuit can be used at master as fully bidirectional, and permits introduction of and extraction of power to the network at any convenient point.

Figure 8:
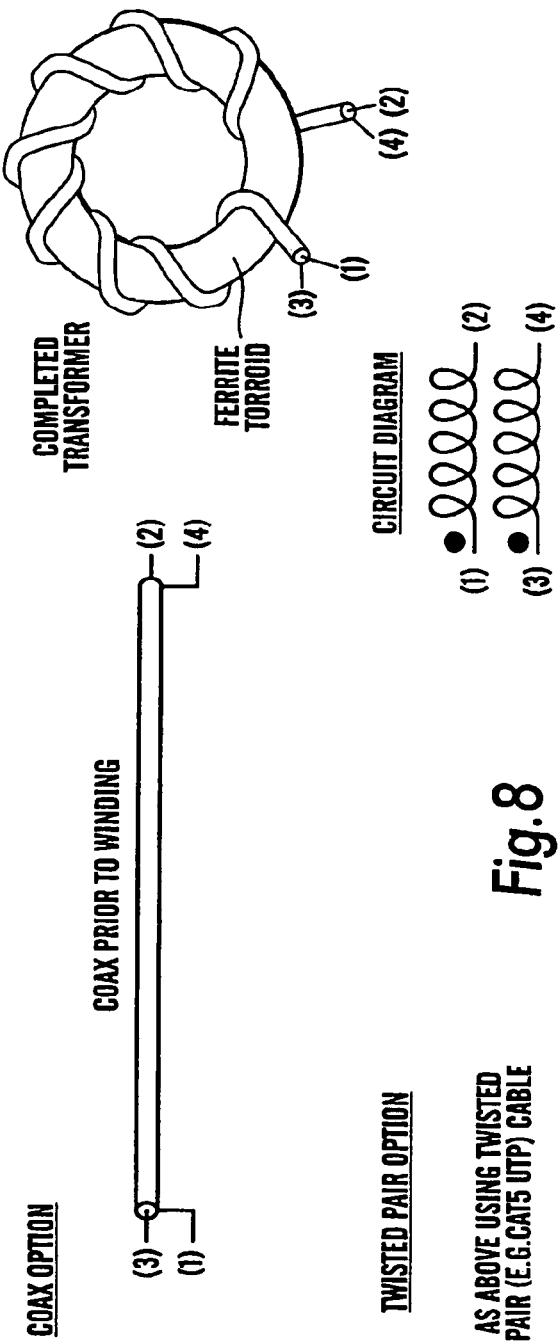
FIG. 8 shows outline diagrams for transformers using coaxial or twisted pair cable.
Figure 9:
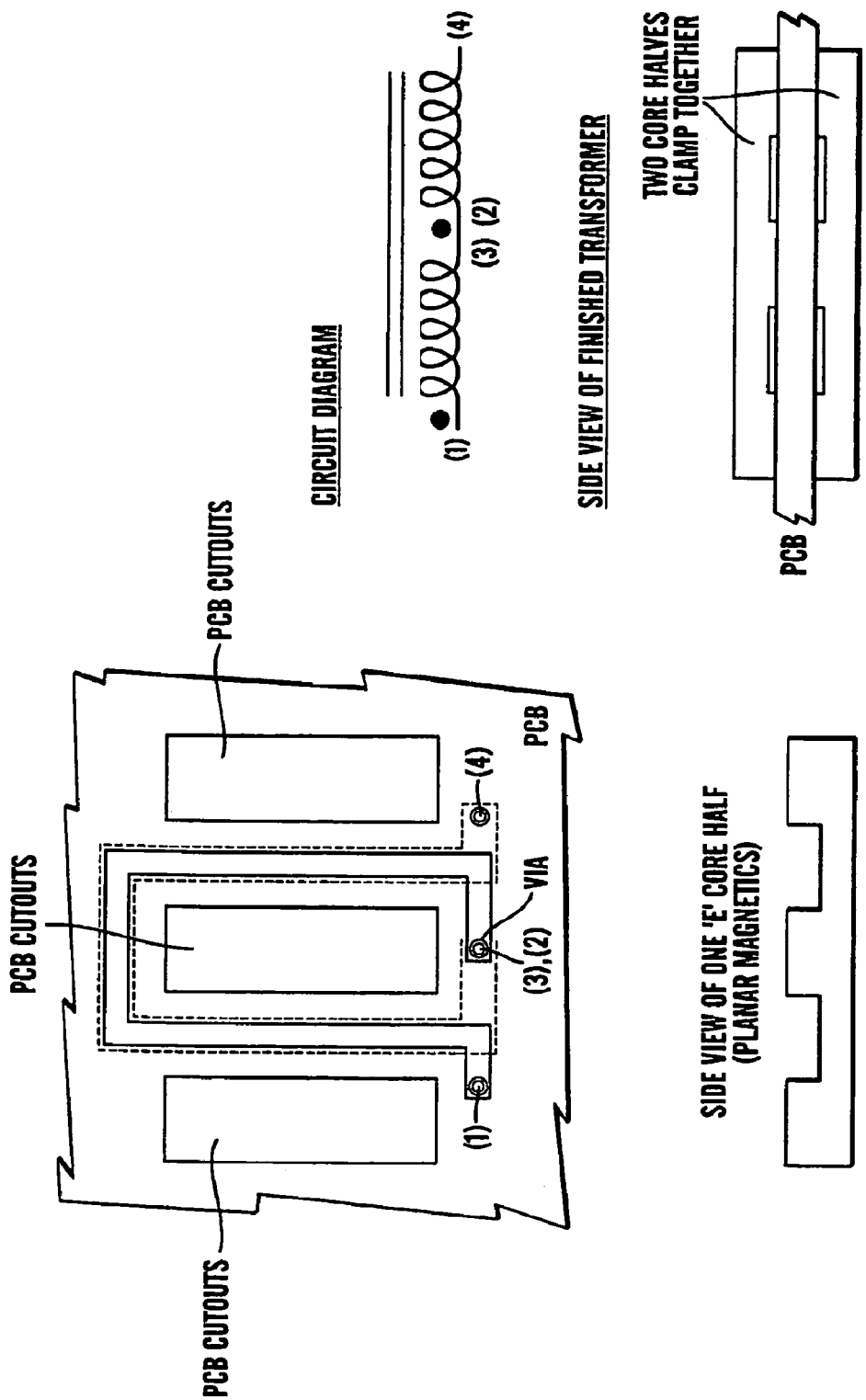
FIG. 9 shows various detail of a transmission line transformer.

FIG. 8 shows transformers using coaxial or twisted pair cable, and FIG. 9 shows a transmission line transformer.

Use of transmission line transformer allows good DC path with low parasitic elements as transmission line construction effectively makes stray capacitance and leakage inductance become the transmission line. The transformer can also with advantage be arranged to perform impedance conversion and single/double ended conversion (balun function). This would be useful for converting the signalling medium between coaxial (unbalanced) and twisted pair (balanced) cabling systems.

Inherent inversion of the through data (both ways) need not cause problems as the master 31 can easily, by software control, invert all it's output data according to the node connected, actually alternately so for ring or daisy-chain configurations. Similarly, reflective signals will alternate in sense for odd and even numbered nodes and this too can be inverted by software control—though not necessarily required when compared to sense of transmitted wave forms.

The described system may be summarised by:
  '1' waves and '1' waves only interpretable directly by the node from the arriving master data.
  Node reflector termination is controlled by second signalling data the node wants to send, i.e. with no reference to prior or currently-arriving data from master
  Master can sort out what it means with reference to what it sent
  Node reflects complete waves, both the high and the low phases in an order depending on first signalling bit value
  Node reflector termination changes state before each new master bit signal arrives
  Node receives one bit signal first from the master data at the same time as reflecting a second signalling bit (independent) back
  The 'short circuit' termination condition cannot really be zero Ohms or else the node cannot detect what master is sending in this condition, so in practice maybe 5× less than characteristic gives good reflection and allows a small master signal to be detected and resolved.
  The '1' and '0' as detected back at the Master end receiver are not useable without reference to what the master sent but are readily sorted out from conventionally stored bit values taken in order.

From one somewhat mathematical viewpoint relative to mosfets: if a node has a '1' to send to master, it signals this by multiplying the incoming master bit signal wave by +1 when making the return reflection (open circuit reflection does this, e.g. as Nmos=off). If it has a '0' bit to send to master it multiplies the master wave by −1 (short circuit refection does this i.e. Reflector Nmos=on). Master sorts this out—to get the binary value the node was sending—by figuring out what the multiplicant was, i.e. +1 or −1. This can be done by multiplying the original binary value sent by master sent by the apparent binary values that came back, on a bit-by-bit basis. Effectively, master solves—[Master Bit sent]×[Unknown]=[Raw bit Received]—which can be simply resolved using an Exclusive-OR gate, or software instructions acting on memorised value of what master sent.

A transformer is not the only feasible way of linking two RF ports with either High or low impedance RF path. A power mosfet or npn-bipolar transistor switch (or other type of semiconductor or electromagnetic switch, e.g. relay) could be used to achieve this purpose.

Figure 10:
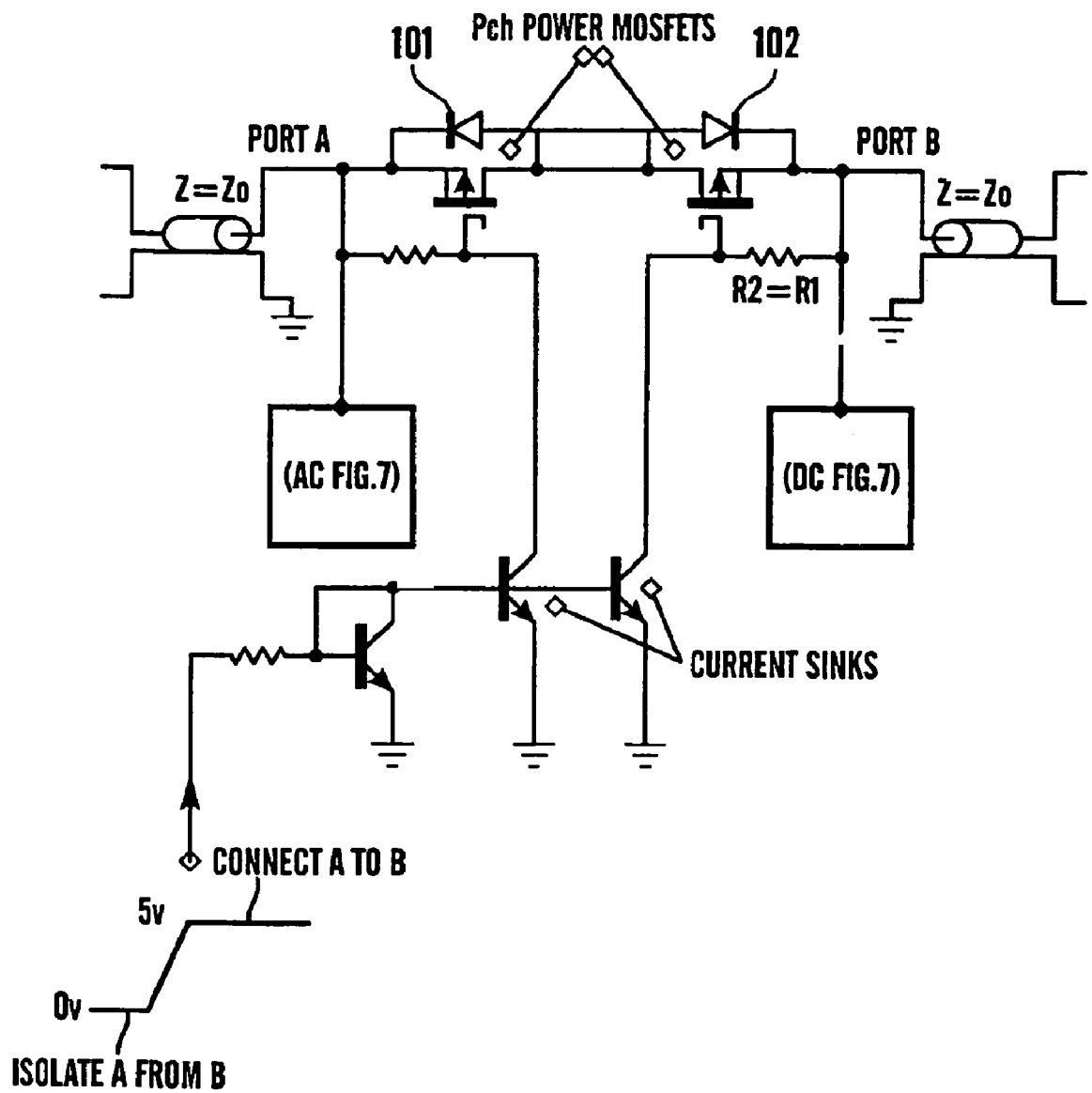
FIG. 10 is a schematic circuit diagram for node provision using P-channel mosfets.

For systems not-needing DC or lfAC electrical supply (e.g. where supply is already available) an entirely monolithic integrated system can be provided using P-channel or N-channel mosfets as switches to connect or isolate one RF port from the other, and to induce "open circuit" reflections or "through" connection as required, see P-channel mosfets 101, 102 in FIG. 10. Standard means of charge injection cancellation would limit spurious signals created during switching.

Figure 11:
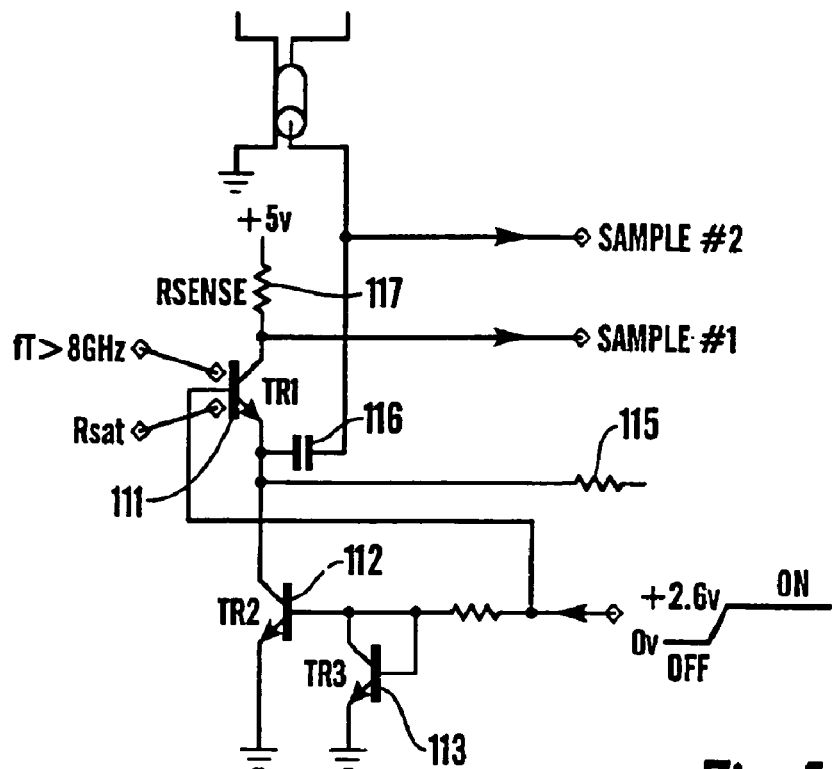
FIG. 11 is a schematic diagram for reflection signal generation using bipolar transistors.

FIG. 11 shows use of bipolar transistors 111, 112 and 113 together with alternative to analogue switch element with a series resistor for the short-circuit reflections allowing detection of the incoming waveform signal with simultaneous short circuit reflection of incident waveforms. When RF switch 114 is Off, the emitter follower transistor 111 is turned Off, the base is reverse biased and the emitter current sink transistor 112 is also turned Off by 0 v on its base. The emitter circuit plus collector for transistor 112 represents a very high resistance in parallel with some small stray capacitance to ground. Resistor 115 provides reverse base bias being typically at least 10Kohms for specific example involving bias level of +2 v and related through monolithic devices to +2.6 v as follows. When the RF switch is Off, AC signals coupling via capacitor 116 experience very little attenuation or reflection since resistor 115 is high and emitter of transistor 111 is reversed biased. In the Off condition, the switch can handle signals of 5 volt peak-peak before TR1 emitter becomes forward biased.

To turn the RF switch On, the switch control line goes to +2.6 v, which very quickly turns On transistor 111 and slightly later, the current sink pair 112, 113. With correct timing it is possible to ensure that there is very little change in voltage at emitter of transistor 111 nor spurious output into source impedance, as the ultimate emitter voltage is also 2 volt (2.6 v–Vbe @ 0.6 v=2 v). In the On state, the emitter current of a bipolar transistor gives an effective output resistance of 25/Ic (in mA) or 5 ohms at 5 mA Ic. This is adequately low relative to source impedance to produce strong short-circuit reflections of waves on the transmission line as source impedance. The switch is turned on or off only outside bipolar bit value signal components, so as to limit spurious signal injection. Resistor 117 is added for collector of transistor 112 so that analogue of the master signal appearing as a modulation of emitter current is available for the node to be able to receive the master data even when the wave is to be short-circuit reflected, the RF voltage and emitter being at zero.

Figure 12:
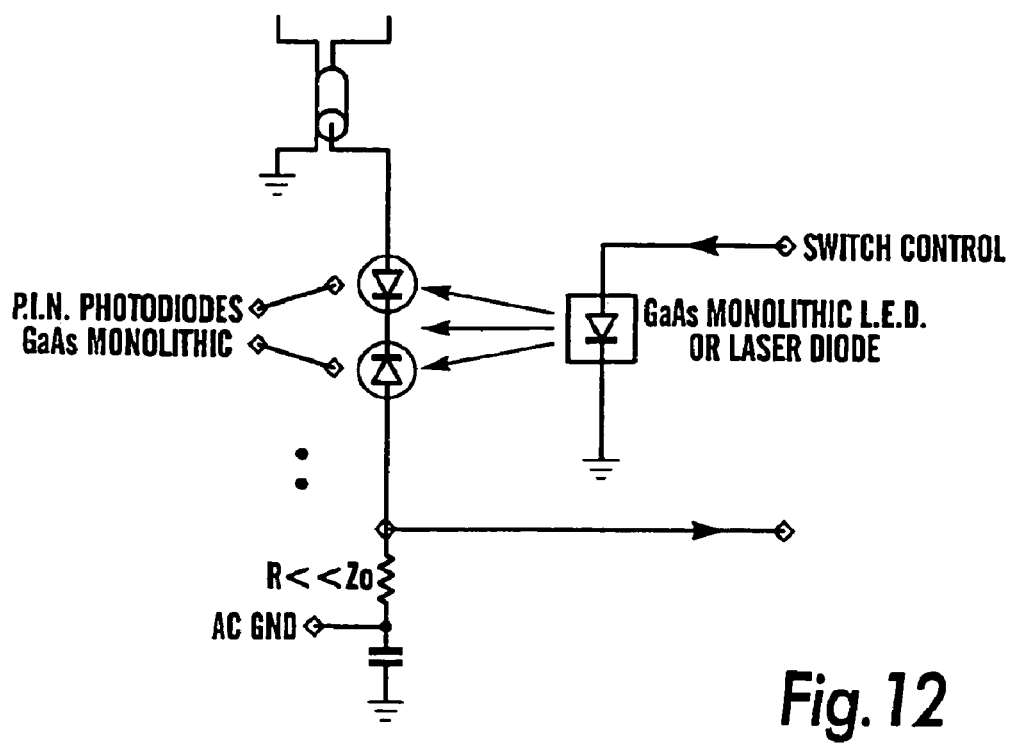
FIG. 12 is a schematic diagram for reflection signal generation using gallium arsenide photoelectric components.

Present silicon technology effectively limits npn-bipolar transistor provision of FIG. 11 to operation up to about 500 MHz. Higher frequencies of operation up to 1 GHz are feasible using gallium arsenide monolithic microwave integrated circuit technology to fabricate switches, see 121 and 122 in FIG. 12, as optionally driven PIN diodes, say with integrated gallium arsenide laser provision 113 on the same substrate as a single monolithic device. Typical on/off switching times can be as low as 0.1 nS.

At very high data rates (e.g. microwave) use could be made of PIN diodes incorporated into hollow metal waveguides of an microwave circulator arrangement to facilitate routing.

Further regarding node provisions and circuitry, short-circuit reflection at transformer mid-point is feasible using previously indicated circuitry design. However, as the on/off times are not critical for such switch, a simple saturated NPN transistor switch could be employed and would conveniently pass DC current as may be desired for power.

Three-level detection for the node may be simplified, as all data pulses sent to the node during communication are reflected (in one way or another) back to the master where they are tested for noise pickup. If "round-trip" pulse quality is satisfactory it seems reasonable to assume that included one-way pulse quality must be acceptable. On this basis, the simplest node needs no additional error detection and correction logic.

A saturated JFET or mosfet or bipolar transistor can be used to extract some operating current from the transmission line and still present a high AC impedance transmission line—and signals might also be incorporated into above centre-tap transformer RF reflection switching. Alternatively, for high power levels an RF inductor could be used to extract significant DC current for powering local electronics or actuators and still present a high AC impedance. Low frequency AC power is also possible (50 Hz, 60 Hz) as this is well below the normal signalling frequencies thus isolated by the small coupling capacitors of the signalling circuits.

Node operation involves initial master output quiescent (interval/gap state Z) and it is assumed that this has persisted for longer than a reset time period, so all nodes have been reset. Then, as for FIG. 7, all nodes will be set (switch 72 On) to reflect the first incoming wave with short circuit termination to produce anti-phase reflection of the first bit signal from the master which will assess the anti-phase reflection signal as above effectively separated out by the virtual hybrid 48. If satisfactory, the master can continue to send and receive data with the node at full duplex capability.

In FIG. 7, node sampling at points numbered '1' and '2' corresponds to short-circuit and open-circuit termination, thus anti-phase and in-phase reflection, thus small and large reflection signals, all respectively signalling from a node to the master involves anti-phase short-circuit reflection switch 72 being on when sending binary value '0' as in FIG. 2B. Sending binary value '1' involves setting as for in-phase open-circuit reflection, specifically have both of switches 72, 73 off. If an incident wave pulse from the master appears at the node, the series inductance of the wide-band transformer, now acting as an inductor (see winding polarity dots), presents a high impedance and so little if any energy is coupled through and on to other nodes—as inductor current cannot instantaneously change and wave-shapes from the master have very high frequency components only.

For every bit of data received by the node via the three-level detector to extract the bit (and set a clock), one bit of node data is returned to the master and the system can operate in a full-duplex mode. Reflection control switches 72, 73 can be changed over only during the quiescent interval/gap times of master pulses, so switch at zero voltage and minimise spurious signal injection. At no time can any meaningful signal pass the node that is active, so nodes further dozen the transmission line from the master get very little if any signals—effectively being reflectively isolated.

As each master transmitted bit signal is received, say shifted into receiving register of the node, the next bit of node data can be sent back, typically clocked out of the sending shift register of the node.

In principle, the master always receives back exactly the same bit signals as it sends—automatically, by reflection and as retrieved at the master for quality checking as above, the reflection signals further representing node data by nature of termination and reflection caused. Checking interpreted binary value of each received bit signal as compared with binary value of what was transmitted enables the master to determine the binary value of the bit signal from the node—same bipolarity means the node did in-phase open circuit reflection so was sending a logic 1, and reversed bipolarity means short circuit anti-phase reflection so the node sent a logic 0.

Because it is fundamentally the same bit signal format used to transmit and receive data, quality checking at the master on received signals will confirm absence of noise, including on round-trip signals, thus give good indication of data integrity both ways.

A useful selection mechanism arises in relation to use of reflections by a node to send all data bit signals to the Master without nodes further down the transmission line getting any signals. After arbitrarily long two-way data transfer is complete with any node, special gap intervals can be inserted in the output of the master. A short gap, typically 500 ns, can serve as a strobe to end communication with the currently addressed node. On detecting this strobe condition, the node ceases to reflect any more signals simply by turning switch 73 off and RF 72 on, which makes the wide-band transformer act as true 1:1 inverting transformer and solidly couple the input and output RF ports in a bi-directional manner—due to common point of the windings going to AC ground via switch 7.2, and coupling input RF energy between input winding terminal (1) and AC ground (2) by via transformer action to output of winding terminal (4). The transformer is inherently bi-directional and connects its ports and the transmission line segments together for RF energy. Master generated pulse waves thus pass by a node with switch 72 On to the next node in the chain. Similarly, reflected energy from nodes past this 'switched out' node will pass through back to the master.

The switch 72 could be a saturated switching element of low resistance, e.g. npn-transistor, then also act as a path for DC current supply for the node. Switching speed is not of the essence as it only needs to be switched on or off once per addressing cycle. In its non-saturated constant-current condition, it also acts as a path for DC current, but presents high impedance for RF energy if the transistor has low collector capacitance.

Strobe condition detection by nodes allows the master quickly to pass through all the nodes before the node with which communication is desired, specifically involving sending single bit signals that will be reflected anti-phase, each single bit signal being followed by a strobe gap period to disable the currently reflecting node until the desired node is reached. Once a node has been de-activated by strobe detect, it cannot become an active reflector again until positively re-activated, see Reset below.

A node might instigate a similar signal back to the master, as communication is independent two-way, say by not reflecting any data for a period during master transmission. This could indicate that all required data has been taken/given by the node, or that an active node does not require any or more of data concerned thus allow the master to move on to the next node in the chain.

A gap much longer than the strobe gap length can be used for the master to indicate that communication logic of an active node is to be reset, thus re-activating the node for selection by the master, i.e. for anti-phase reflection of next incoming master bit signal. If the master keeps the selected data route busy with data signals and short strobe gaps de-activation nodes cannot even be selected, i.e. stay de-selected until there is a preset gap.

A node might also generate a signal like this during normal duplex data transfer after being properly addressed, say to indicate to the master a critical condition mid-way through a long data transfer, e.g. buffer full, data error etc.

In customary two-way data transfers with the nodes on a sequential polling basis, through to the last node concerned, master uses a reset gap to reactivate all the nodes, typically for a new selection sequence.

No additional selecting/address mechanisms, e.g. identifier codes, such as serial numbers or addresses, or software protocols are required for unique selection and communication with any node anywhere in the system.

Such sequential selection scheme can be extended to provide a useful network feature, say for digital TV distribution and/or videoconferencing, where it is desirable to send the same data to multiple nodes simultaneously. If the state of the bit signal first sent to a node was latched as well as anti-phase reflected, and if this state corresponded to binary value '1', then after the strobe period, all nodes addressed with the same binary '1' signal could still be enabled to receive the data. Nodes not intended to receive the broadcast data Would be addressed with a binary '0' bit signal.

The master could so select nodes right through to the customary final passive terminator, then begin to send data on a broadcast basis to all the selected modes. Operation would be in half-duplex mode as none of the nodes addressed for broadcast should try to transmit own data back to the master, so can present one termination continuously. Each node needs only an indicator that it is odd or even and to make a one-bit comparison.

Interestingly, multi-speed operation capability of three-level systems hereof itself allows a form of selection, as nodes with slow AC response will automatically significantly attenuate transmitted data below the receive threshold. Indeed, attenuation by cabling can also prevents low speed nodes from ever seeing high speed data at the end of the transmission line.

Examination of the circuit diagrams of the drawings reveals a good DC current path right throughout the network. This path begins at the master end and passes through the transformer windings and returns through braid of coaxial cable or other conductor for twisted pair or microstrip. This enables supply of DC or low frequency AC power by way of the transmission line itself.

Figure 13:
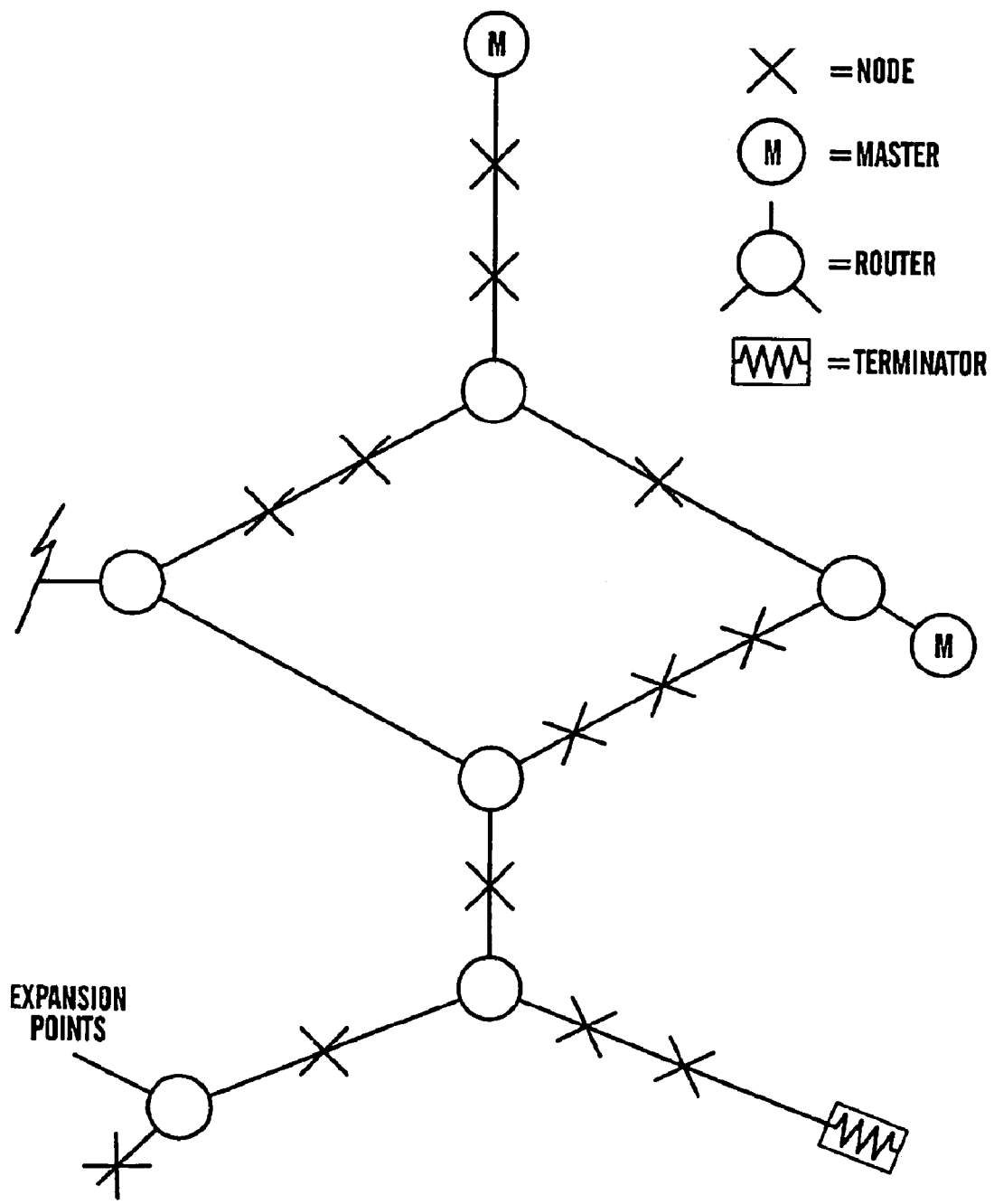
FIG. 13 indicates outline of a complex interconnection network.

Implementation of systems of this invention is also viable for interconnections more complex than daisy-chains or rings, see for example a so-called internet of which FIG. 13 shows a part involving more than one master (M), many nodes (X) in several branches, and router provisions at junctions between branches.

Figure 14:
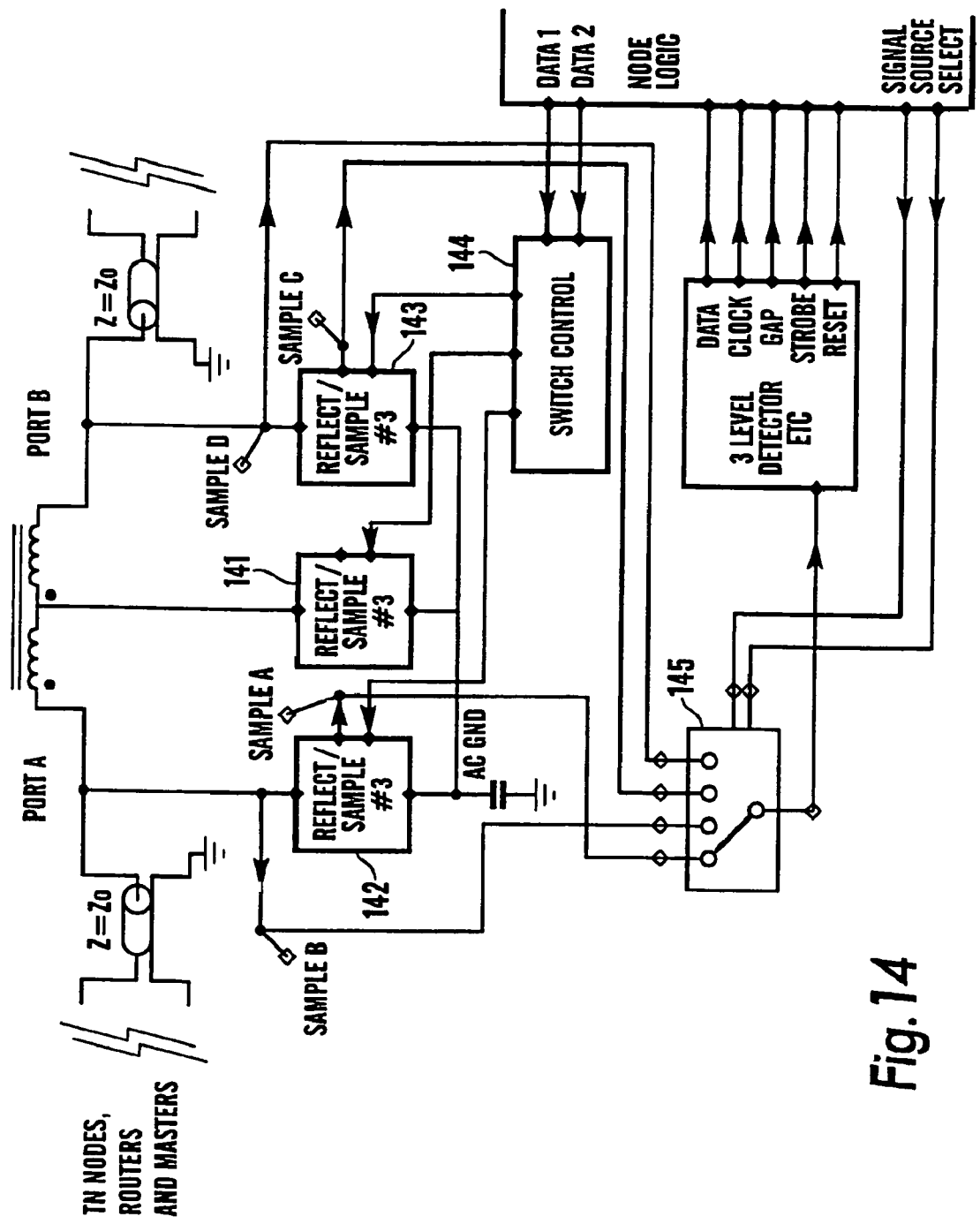
FIG. 14 is a schematic diagram for node provision allowing two-way communication.

FIG. 14 shows a node modified for accessing and communication from either side of its transmission line connections, as would, of course, be desirable even for true ring networks. FIG. 14 shows three RF reflector switches 141, 142, 143 and four coupling points (A-D), along with consequential two-wave data in and three-way out switching provision 145 according to signal source and additional logic 146. When in communication with a master unit from one side, the other side is effectively 'locked out' as the node is configured for constant reflection (either open or short circuit) to the master concerned. In both these cases, series inductance of the broadband transformer 147 presents an AC "open circuit" condition to a master trying to access an 'engaged' node from the other port no matter if the node is reflecting open-circuit or short-circuit to the master in control.

A master can easily detect an 'engaged' state of a node, say by reflection of bit signal being of 'open circuit' in-phase nature; If a node usually responds to the first bit signal from the master with a short circuit anti-phase reflection.

Simultaneity of attempted access to a node is unlikely as there is only a very short time period for node switching. If it happens, received quality errors by the master that loses out will soon disclose that a line of nodes is engaged beyond the one last active or addressed. A master could retry a node until it becomes available by repeatedly sending-bit signals to it until the reflection signal changes from that for "engaged", as would happen after the other master had sent a node reset by going quiescent for the reset-period and re-activating the node for selection.

An important feature of true ring or internet systems hereof is that two adjacent nodes on the same length of transmission line cabling can be in communication with different masters (to left and right as the diagrams are presented) without interference as substantially all energy from each master is reflected back to give reflective isolation. A large inter-network can be imagined with many masters and nodes. Reflective isolation permits simultaneous activity on multiple branches of the network; thus two separate communication channels on one length of cable, without having to incorporate special provisions. Total data rate can expand as a system grows.

Routers have been developed with valuable features for a combination "ring" and "star" topologies as well as Internet topologies, particularly as to allowing expansion in the number of nodes connected without exposing the data pulses to many spuriously reflective interconnections (as for all the nodes in a long line or loop), and as to providing 'bypass' relative to strings of nodes for any reason, say if using or benefiting from dedicated cables.

Figure 15:
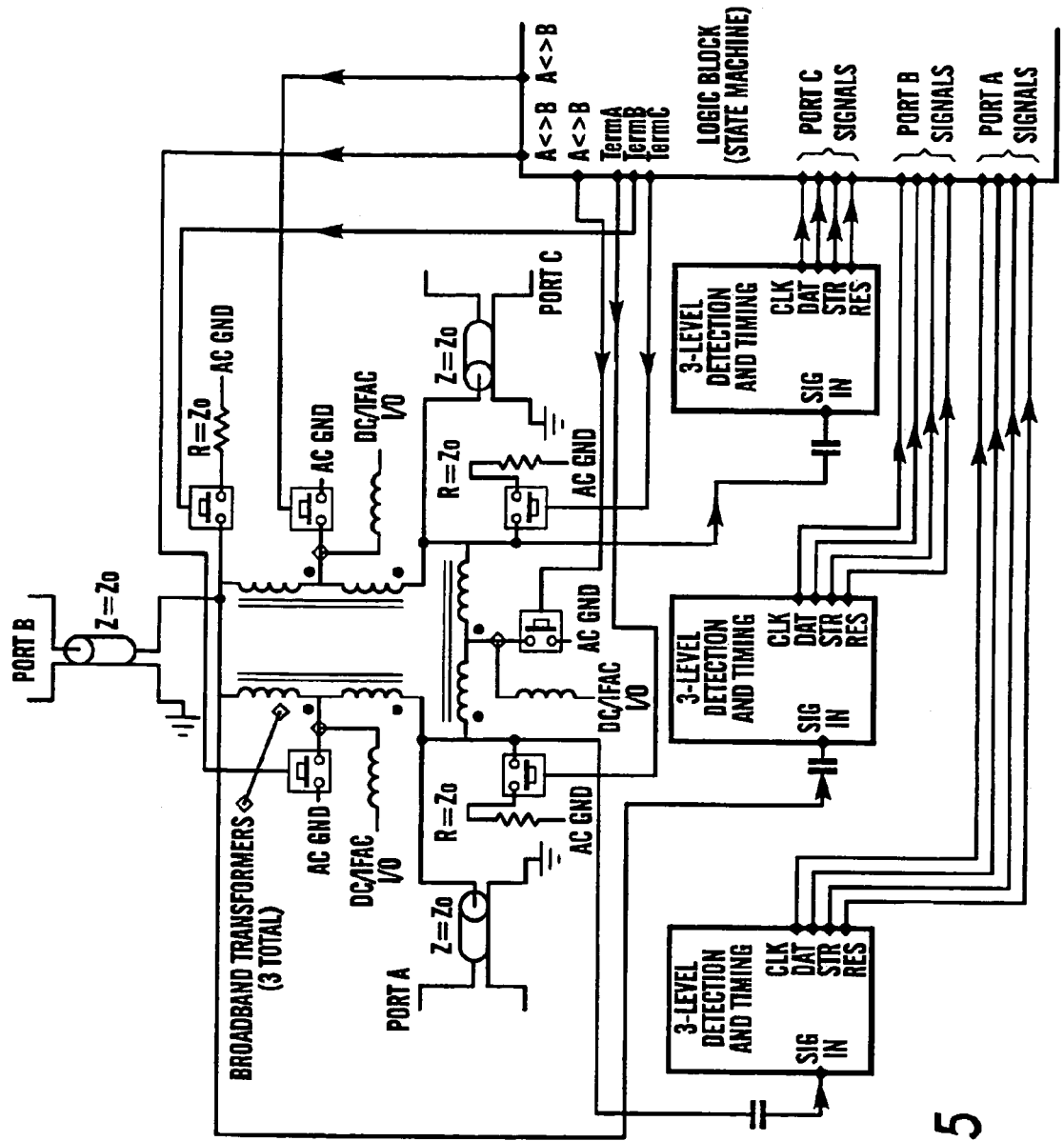
FIG. 15 is a schematic circuit diagram for routing provision, and FIGS. 15A, B concern reflection/switching.

The router of FIG. 15 is made up mainly of components and blocks already described so description is concentrated on differences. The 'logic block 151' has functions readily implemented by hardware logic or in software, or a combination. The router behaves somewhat like a node in using the same signalling, but has no need to send or receive large amounts of data. Its main purpose is to allow any master quickly to address specific nodes in a large system and to isolate most of the nodes from signals from the master, thus minimise attenuation and spuriously reflection effects. Three ports are shown, much as a T-connection, allowing one transmission line to be split or for three lines to be joined (depending-on perception).

Routing from one port to one other—effectively connecting them for RF signals is simplest—say leaving other port always appearing open-circuit and is effectively a three way switch allowing easy implementation. However, multi-way routers are feasible.

This router will also present an 'engaged' state/condition by in-phase open-circuit reflection to any master signals arriving at the port that is switched out. Control can be from any one of the three ports. On power-up, RF switches being switch in proper passive terminating resistors of the correct characteristic impedance for all lines as the only alternative to open circuit, short-circuit to AC ground and anti phase not being required as routers do not reflect energy. This masters sending selection/addressing signals to an available router to distinguish it from the response of a node, i.e. absorption rather than reflection. The router will switch by the first valid master bit signal it receives from any of the three ports, say binary '1' value for the left hand port as clockwise, and binary '0' value for the right hand port or anti-clockwise.

Once switched, the router cannot be changed until a reset condition is detected at the port which instigated the switching. All the nodes up to any active node on the non-selected line of the router will get no signal which will be interpreted as the 'reset' condition and prime them for later selections. After a reset condition/period is detected from the port that set the path of the router, all the inputs are returned to characteristic (absorb, i.e. non reflect) termination resistance and the router is available for control by the first master signal to arrive on one of the three ports.

Other hardware or software logic features including allowing the router to make its characteristic impedance termination persist for a particular port to furnish a convenient termination when using above broadcast feature, and/or to detect when a master sends a routing direction signal is followed by a strobe (which it would not normally do). A unique bit signal can cause the router to hold or restore the characteristic termination impedance for the input port, say ignore the route selection just specified. The other two ports could still be switched together by master signals on either one of those ports, the 'engaged' signal being returned only should an attempt be made to route onto the port with the persistent characteristic termination. Reset condition detected has the characteristically terminated port can clear all the engaged logic and return the port to normal operation.

DC or low frequency AC power can be applied to the network at routers to maintain a good low resistance supply of power to the nodes and other equipment attached.

Such routers can facilitate large interconnected arrays of nodes and facilitate redundancy in possible paths between nodes, for which selection paths can 'snake' around the network. If one path is found to be inoperable or engaged, an alternative selection path could be tried without needing any complex or expensive electronics or software.

Figure 15A:
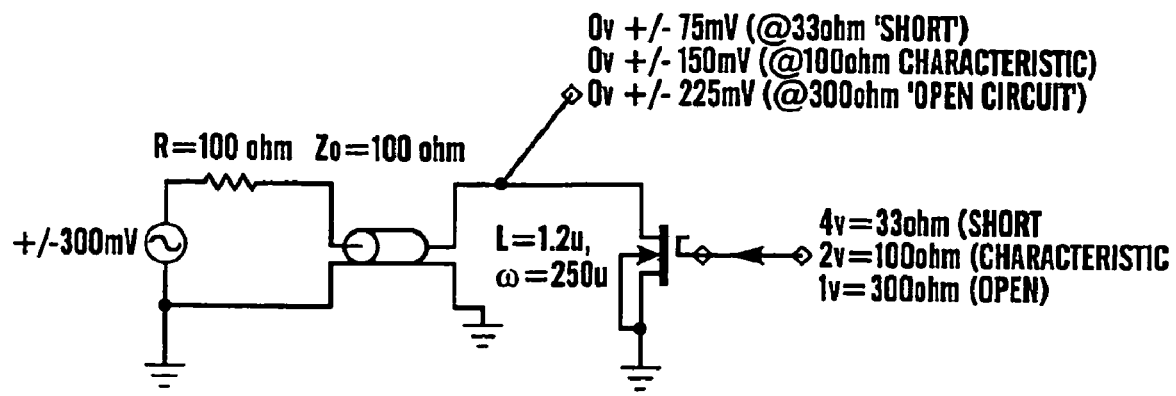
Figure 15B:
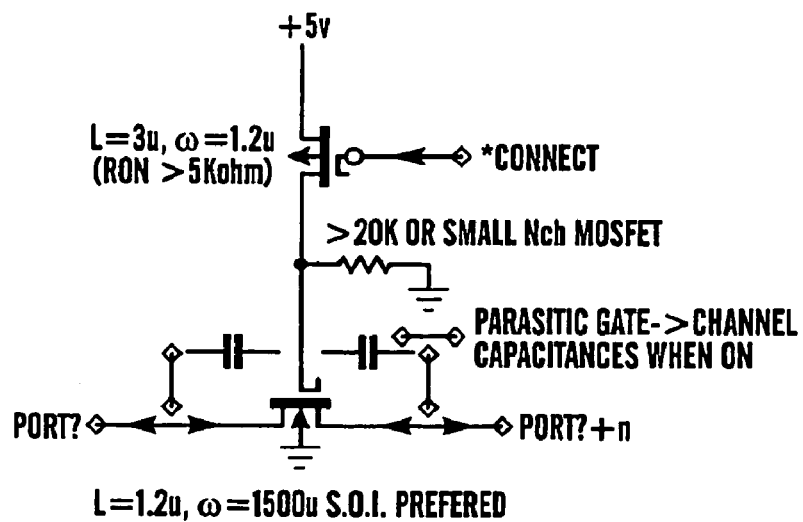

FIGS. 15A,B show advantageous router reflection/switching. In FIG. 15A, voltage levels are centered around ground and low excursion to be compatible with Nch mos switches and routable through modern CMOS Ics without causing latch-up as bulk COOS cannot accept large negative inputs. Actual ground, not AC ground, can now be used to terminate reflection transistors thus avoiding large capacitors and facilitating full IC integration. This reflection switch can have gate modulation to control 'On' resistance. A single transistor could implement range of resistances required for open circuit, characteristic, short circuit conditions, and can be fed with an analogue signal to reflect. Another option is to use weighted size reflection transistors which operate in parallel when activated. In FIG. 15B, an Nch router switch is capable of routing such limited-magnitude signal based at ground (0 v). Parasitic gate→channel 'On' capacitance is allowed to swing with signal for low losses. Small Pch turn-on switch represents the only load and can be >5Kohms=insignificant. Other parasitic capacitances can be reduced using Silicon-On-Insulator methods possibly producable on conventional bulk CMOS by forming high-resistance Poly1 channel/Poly2 gate Polysilicon transistors on the Field Oxide (FOX) regions. Thermal annealing or melt-recrystalisation would improve performance but probably OK for this purpose as formed.

A master controller can fully investigate and establish the topology of any network onto which it is attached. Thus, after issuing a node reset condition, the master polls all the nodes on the highest level line using above bit signal strobe method, say as continuous stream of binary '1' bit signals with following strobe periods. Reflected signals from each node should be "anti-phase" if polled properly. Engaged nodes reflecting 'in-phase' can be retried until free.

A router switch will be operated by the binary '1' bit signal unless in use, say switched by another master, whereupon it too will return an open-circuit anti-phase an engaged signal requiring retrying. A free router will be identified as such, rather than a node, as it absorbs the signals without reflection, usefully causing a third 'gap' state to the bit signal before switching to the direction specified by the absorbed bit signal. The master will detect this no-reflect gap pulse in it's returned data stream, so knows recognise the router and knows which way it told switched.

Ultimately the master reaches the end of the "All '1's" path through the network to a passive termination of characteristic impedance recognisable by signal absorbing without the no-reflect gap condition. The master now knows many nodes are on each part of this particular 'All 1's' route through the network plus the locations of routers up to the end of the path. Network investigation continues iteratively by the master first re-running the same sequence up to the last router then sending a '0' bit signal to investigate the branches off the last leg of the previous route. The master iterates until it has fully explored every branch and chain of the network to build up an internal network map of nodes, routers and terminations.

For complex internet arrangements with multiple masters, network investigation may lead one master to find another, at least assuming the other master is quiescent. Masters can have software protocol so that they recognise each other, preferably also share information. This could be a basis for a parallel processing system.

Application is envisaged to parallel processing up to supercomputer architectures using large multi-bit bus systems where say 32 or more parallel channels of this system can be used (e.g. on microstrip media), and the nodes could actually be of so-called "wide" parallel input nature for peripherals or memory. Signal routers can be also extended to 'n' bits.

Conventional data bus topologies (e.g. PCI bus, VME bus, NuBus) only allow one bus "owner" to control the bus at any one time. Total bus bandwidth is fixed and does not grow as more peripherals wide nodes are added. Systems of reflective isolation proposed herein are applicable between adjacent sections of bus and 'engaged' signalling lets every section of a bus be split and operated point to point at the full data rate. Cards which interchange large amounts of data with each other can be located adjacent in the bus. A single 'master' program is still able to communicate with the cards individually if periodic 'idle' slots are inserted.

Standard computer bus topologies are unable to extend more than a couple of feet in length due to transmission line and reflection effects. This is reduced by application of systems hereof. Half-duplex systems hereof are particularly useful for getting large amounts of data from a distant source at high speed with good rejection of spurious reflections from cable.

The system is applicable to combinations of a multi-bit (e.g. 16 bit, 32 bit, etc) bus system perhaps using microstrip line internally to a computer and twisted pair ribbon cables etc for external connections. It is feasible to combine 32-bit, 16-bit, 8-bit and 1-bit routes together. By starting with a 32-bit wide system, each bit could ultimately be the source of a new, independent single-bit route but could first reduce to two 16-bit busses then four B-bit busses. An internal computer data bus could 'come out' of the chassis of a PC and become an office network without intervening buffers etc. At 300 Mbps, a 32-bit system could achieve a throughput of 1.2 Giga bytes per second over a reasonable distance with low radio frequency interference (RFI/EMI).

Envisaged integrated circuit embodiment of all or parts various circuitry hereof include use of GaAs technology (ultra high speed), ECL process technology (very high speed) BiCMOS (high speed), CMOS (moderate speed).

Embodiments of this invention can incorporate time domain reflectometry (se FIG. 16) by reason of inherent use and detection of signal reflections on transmission lines such as cable. Receiver circuitry at a master hereof can be supplemented with a high resolution timer running from the 3× clock generator plus adjustablility of receive threshold settings, typically DAC controlled; and can form the basis of a time domain reflectometry system where exact round-trip signal times and amplitudes can be monitored from a master and back again.

With programmable receive thresholds the master can lower the thresholds and detect low-level reflections from cables, connector damage etc. This facilitates exact location of a fault in a line since any deviation from nominal impedance (higher or lower impedance) caused by a short circuit or an open circuit results in a reflection. Also, when a coaxial cable is crushed or stretched badly it experiences a measurable change of characteristic impedance and therefore gives reflections.

A master hereof typically includes a programmed computer which can easily detect and store the presence of a new node the next time a full network explore is performed. With time domain reflectometry included, a new detected node can have it's position (in electrical length units) determined by the time of flight of a bit signal. A router can be added at any point to expand the system. Multi-way routers with internal terminations can be used to allow for such as a 8 port "extension socket" type cable into which equipments can be plugged.

When getting data from far distant nodes at high speeds, a full duplex operation may not be practical. The problem arises from the fact that spurious reflections from master output signals by in-between nodes and cable and/or connector mismatches can give a return signal in which the reflected signalling energy from the node can be swamped by the spurious reflections. One remedy would be to reduce the data rate as reflections reduce with operating frequency esp. stray capacitance reflections.

Another would be to have the nodes able to generate their own wave-shaped three level outputs and include a local clock generator of variable frequency to suit cabling, on every node so clock pulses by the master were not present during reading of data from the node—though this is seen as undesirable from the aspect of cost, complexity, power consumption and the inevitable protocol overhead probably requiring local software.

Help is now proposed for this problem, keeping the nodes as simple as possible. The basis is that whatever actual transmission line connection is concerned its spurious signalling effects are inherently of a substantially constantly repeating nature for each bit signal hereof including its reflection. This spurious content is actually the extent to which there is difference from exact matching in the identifying comparison hereof. Perhaps ideally, that would be stored as output from the relevant differential amplifier for prescribed known test bit signal transmissions and reflecting and read back synchronously as a correction for each received signal. However, that is too complex to consider trying to do when the whole rationale of this invention is reducing complexity in favour of simplicity, though a charge-coupled-diode analogue memory could well be practical.

Figure 17:
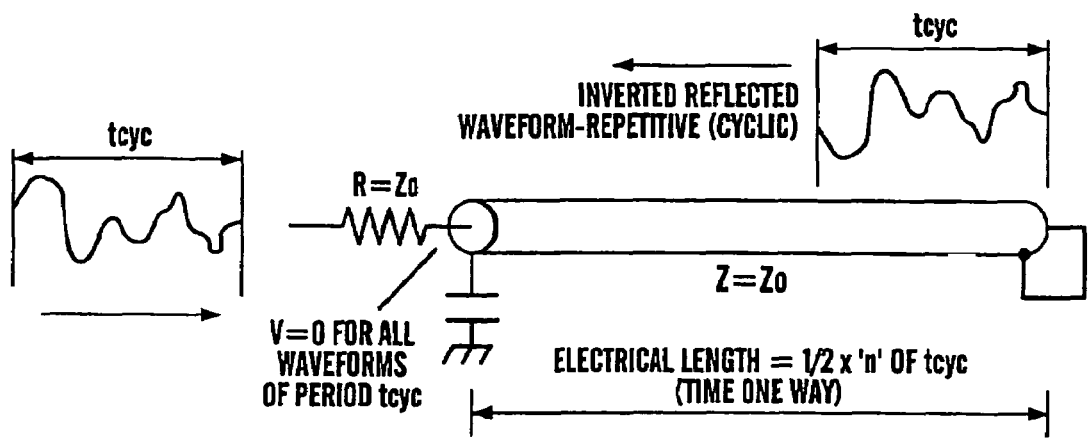
FIG. 17 shows outline for a transmission line memory function in dealing with spurious signal effects.
Figure 18:
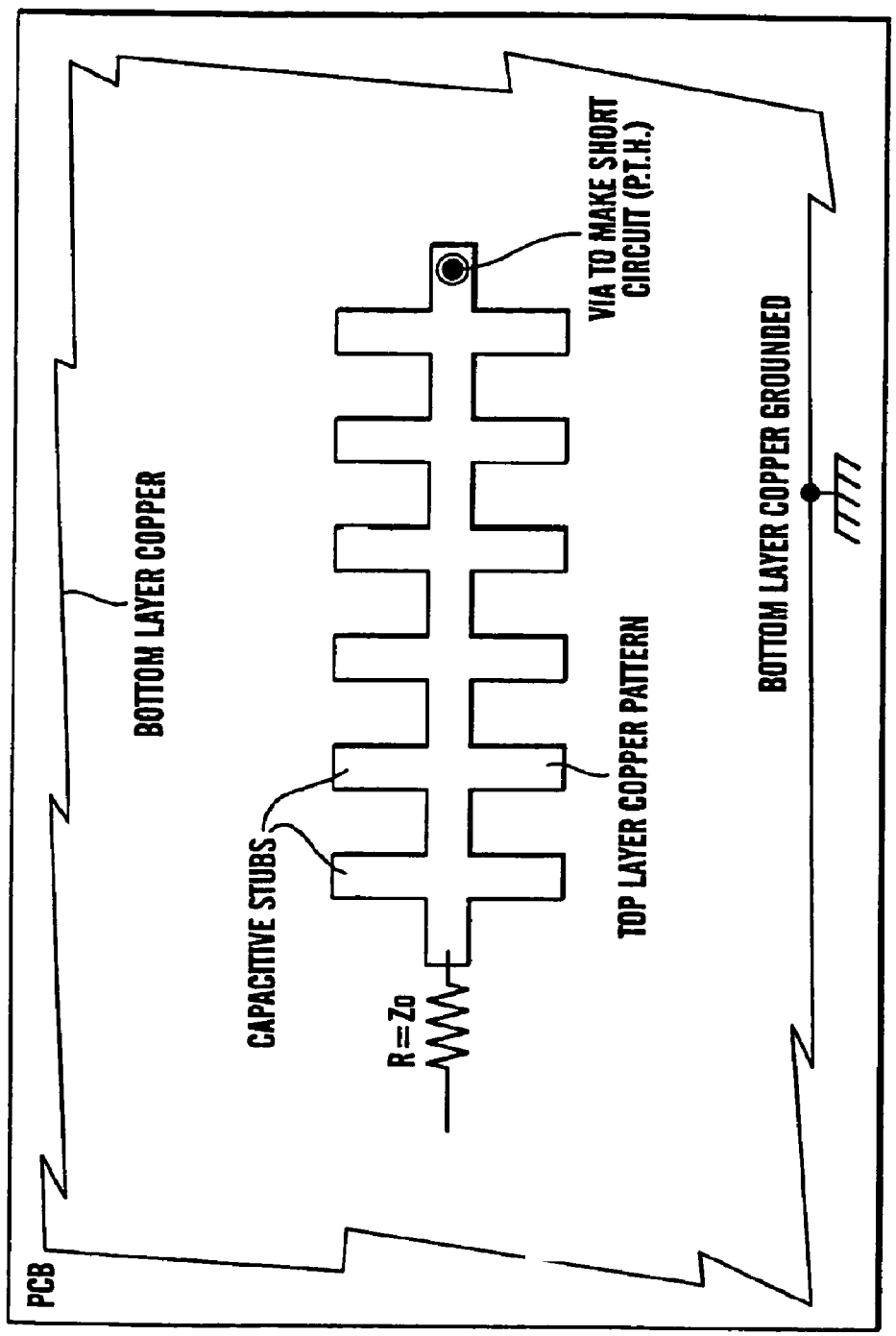
FIG. 18 shows outline for a microstrip transmission line.

Instead, advantage is sought from the fact that it would be equally effective to hold bit signal versions complete with spurious effects, and compare them with the incoming reflected signals. A successful practical approximation of this has been achieved using a length of coaxial cable as a kind of memory device for actual reflected signals, see FIG. 17.

The coaxial cable length is such that an exact multiple of the bit signals will traverse it twice—from input to a fully reflective termination and back—at the transmission bit rate of the system. For a nominal 200 Mbps transmission rate using 3×1.55 nS per bit signal a coaxial cable length related to 12.5 Mbps would hold sixteen bit signal wave-lengths. For good coaxial cable rated at 0.8 of speed of light, required coaxial cable length 10 meters.

The input node is zero volts for any arbitrary regular waveform at 12.5 Mhz and multiples thereof. For example, considering the leading positive edge of a regular square waveform that will travel down and return as leading negative edge of a pulse of opposite polarity in transit time 80 nS, so a repetitive wave-form of period 80 nS will have a rising edge at the coaxial input/output node at exactly the same time—so will input and reflected voltages will cancel as the series drive resistance into the coax matches the wave impedance of the reflected wave (assume output impedance of transistor concerned is zero). This cancellation will persist for the entire positive excursion of the square wave, and further through the negative excursion, and so on—and applies to any waveform repetitive within a time period integer divisible with no remainder into the round-trip time in the coaxial cable memory hereof, see 161 in FIG. 17 for which there will be inversion of reflected voltage but same magnitude going back towards the input/output node. There will also be rejection of non-perfect CMRR of the receive amplifier.

The operating frequency can be of a voltage controlled nature and set by actual response of the coaxial cable. The RMS voltage (rectified power monitor) of the receive signal can be a digitised variable known to the master controller.

When fetching data from a node as required, the master will work in half duplex mode, and send pulses to clock the remote node that are of constant binary wave values—either a constant stream of '1' or of '0' wave-forms. These pulses are repetitive within the round trip time of the coaxial cable memory 161 and reflections from these output pulses can be used to prime the memory 161, resulting after sixteen pulses and full traversal of the network path concerned in cancellation no matter what the phase relationships of the individual sources of spurious reflection and how they combine.

The master can periodically route regular waveform directly into the coax memory for a tune-in period and frequency can be adjusted using a DAC driving a varicap oscillator until reflected power measured at the coaxial memory entry is minimum, i.e. the system self tunes to suit the coaxial memory When the coaxial memory is primed and the node begins to output data with short-circuit or open-circuit reflections same at the master receiver will also go to the coaxial memory drive amplifier. The coaxial memory may produce cancelling or additive effects as what is streaming back out of the coaxial memory entry point is cancelling only the repetitive unwanted signal. A very clean reproduction of the desired signal can result with the repetitive noise.

Figure 16:
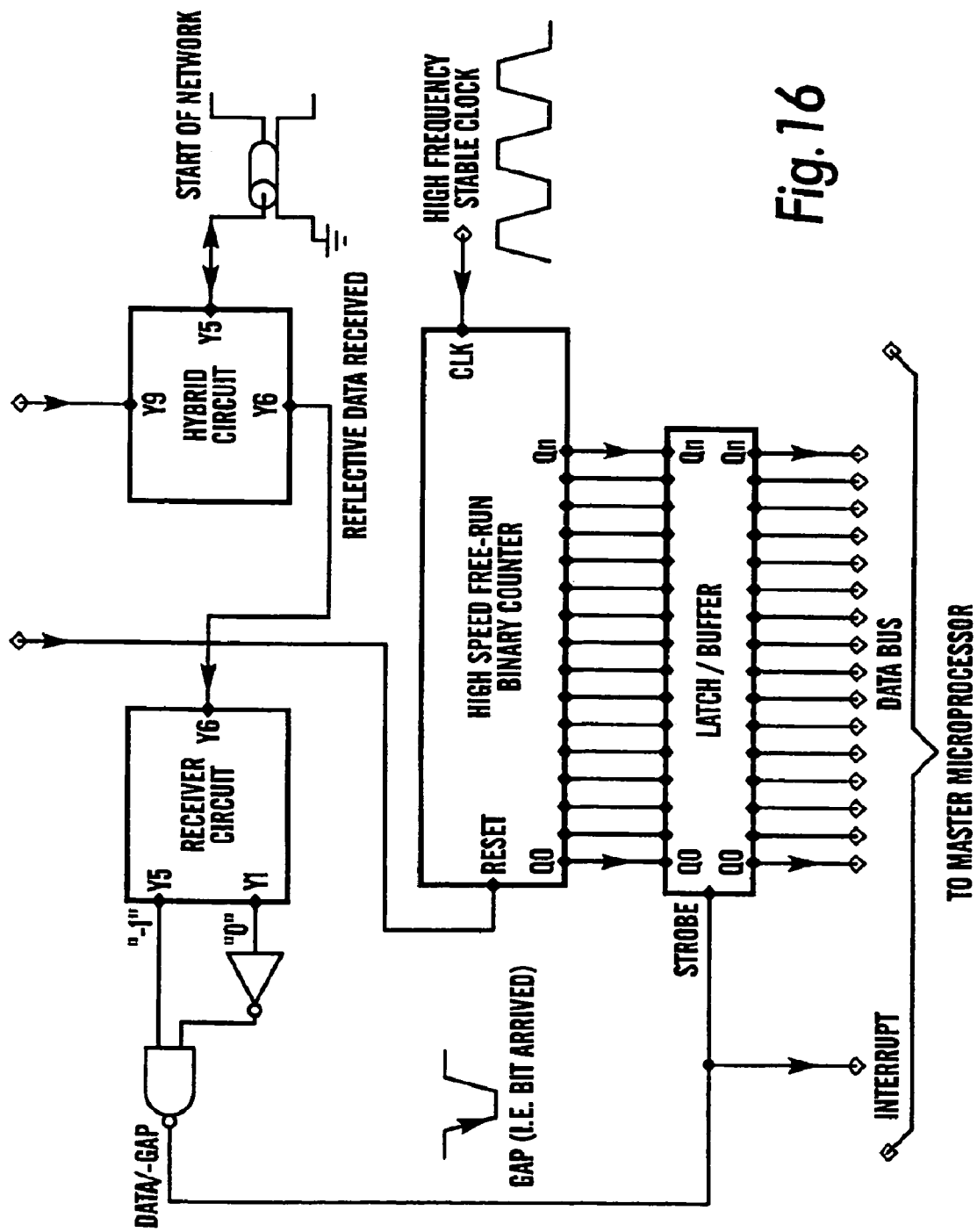
FIG. 16 is a block circuit diagram for extension to time domain reflectometry.

The first pulses will be checked by the three-level detection circuit and pulse quality logic as per normal. For later pulses compared with processing without the coaxial memory, earlier (first) pulses entered into the coax will reappear after inverting reflection. For coaxial memory round-trip storage time of 16 data bit signal cycles no effect is seen at input/output node until the 17th bit signal, which becomes added to the reflected inverted version of the first bit signal which now appears out of the coax memory at the time when the 17th bit signal is coming in. The wave diagrams of FIG. 16 show results including cancellation. All three possible final states are detected by the level detection logic. Also, as the first pulse was received normally (addition-free), digital logic can determine what the 17th bit signal state must have actually been to produce the end result. By always maintaining a digital record of the previous 16 states, the true state data can be established for each bit signal as it arrives, typically also involving software in producing correct stream of bit values for the master.

Half-duplex fetching operation alternating with broadcast transmission allows for Video conferencing where one frame of video data can be gathered then sent to many different locations on the network.

Viable alternative to coaxial cable in this memory application is microstrip transmission line with capacitive stub branches, see FIG. 16, to slow down the effective velocity, as could be especially useful in PCB backplane applications.

As described above, with time domain reflectometry included, distances (in terms of electrical length) to all nodes will be known. It is possible, after determining the spurious response of all nodes at all frequencies and together with the electrical length information (phase) to predict digitally what the spurious reflection pattern would be for any set of output data produced by the master. Using a very high speed analogue-to-digital convertor in receiving the reflection signals, such predicted reflection pattern can be subtracted (in software) from the actual return signals to leave only the reflection response from the communicating node. An alternative would be to use a high speed DAC output to subtract using analogue summing amplifier from the received signal to leave the desired signal.

The invention claimed is:

1. A method of signaling between first and second equipments, the method comprising the steps of:
   (a) transmitting a signal from said first equipment to said second equipment;
   (b) reflecting said signal by deliberately varying the reflection of said signal back to said first equipment in a selective manner that varies said reflection corresponding to a first bit sequence;
   (c) receiving the signal thus reflected at said first equipment; and
   (d) comparing said signal thus reflected with said transmitted signal to thereby extract said first bit sequence.

2. The method of signaling according to claim 1, the method comprising the steps of transmitting a signal corresponding to a second bit sequence from said first equipment to said second equipment, and extracting said second bit sequence from said signal at said second equipment.

3. The method according to claim 1, further comprising checking at said first equipment said signal thus reflected.

4. The method according to claim 1, the method comprising the step of reflecting said signal back to said first equipment in phase with said signal.

5. The method according to claim 1, the method comprising the step of reflecting said signal back to said first equipment out of phase with said signal.

6. The method according to claim 1, wherein said first and second equipments are linked by a transmission line having a reflective termination at said second equipment, the method comprising the step of varying the reflective property of said termination in a manner corresponding to said first bit sequence.

7. The method according to claim 6, further comprising the step of varying the reflective property of said termination between open-circuit and short-circuit conditions in a manner corresponding to said first bit sequence.

8. The method according to claim 2, wherein said first and second equipments are linked by a transmission line, the step of transmitting a signal corresponding to a second bit sequence from said first equipment to said second equipment comprising the application of successive oppositely-directed voltage excursions to said transmission line.

9. The method according to claim 8, further comprising the step of varying the phase of successive oppositely-directed voltage excursions in dependence on said second bit sequence.

10. The method according to claim 8, wherein all of the excursions are to substantially the same extent.

11. The method according to claim 9, wherein all of the excursions are to substantially the same extent.

12. The method according to claim 8, wherein said oppositely-directed voltage excursions are of opposite polarity.

13. The method according to claim 9, wherein said oppositely-directed voltage excursions are of opposite polarity.

14. The method according to claim 10, wherein said oppositely-directed voltage excursions are of opposite polarity.

15. The method according to claim 12, wherein said oppositely-directed voltage excursions are symmetrical about nominally zero volts.

16. The method according to claim 8, the method comprising the step of applying a further voltage component in association with said oppositely-directed voltage excursions.

17. The method according to claim 9, the method comprising the step of applying a further voltage component in association with said oppositely-directed voltage excursions.

18. The method according to claim 10, the method comprising the step of applying a further voltage component in association with said oppositely-directed voltage excursions.

19. The method according to claim 12, the method comprising the step of applying a further voltage component in association with said oppositely-directed voltage excursions.

20. The method according to claim 15, the method comprising the step of applying a further voltage component in association with said oppositely-directed voltage excursions.

21. The method according to claim 8, the method comprising the step of applying a further voltage component in association with a plurality of said oppositely-directed voltage excursions.

22. The method according to claim 9, the method comprising the step of applying a further voltage component in association with a plurality of said oppositely-directed voltage excursions.

23. The method according to claim 10, the method comprising the step of applying a further voltage component in association with a plurality of said oppositely-directed voltage excursions.

24. The method according to claim 12, the method comprising the step of applying a further voltage component in association with a plurality of said oppositely-directed voltage excursions.

25. The method according to claim 15, the method comprising the step of applying a further voltage component in association with a plurality of said oppositely-directed voltage excursions.

26. The method according to claim 16, wherein said further voltage component has a magnitude medial of said voltage excursions.

27. The method according to claim 21, wherein said further voltage component has a magnitude medial of said voltage excursions.

28. The method according to claim 26, wherein said further voltage component is a constant substantially zero volts.

29. The method according to claim 16, wherein a step of checking at said first equipment said signal thus reflected includes checking the timing of said voltage excursions.

30. The method according to claim 21, wherein a step of checking at said first equipment said signal thus reflected includes checking the timing of said voltage excursions.

31. The method according to claim 26, wherein a step of checking at said first equipment said signal thus reflected includes checking the timing of said voltage excursions.

32. The method according to claim 28, wherein a step of checking at said first equipment said signal thus reflected includes checking the timing of said voltage excursions.

33. The method according to claim 16, wherein a step of checking at said first equipment said signal thus reflected includes checking the interval before or after a first or second voltage excursion.

34. The method according to claim 21, wherein a step of checking at said first equipment said signal thus reflected includes checking the interval before or after a first or second voltage excursion.

35. The method according to claim 26, wherein a step of checking at said first equipment said signal thus reflected includes checking the interval before or after a first or second voltage excursion.

36. The method according to claim 28, wherein a step of checking at said first equipment said signal thus reflected includes checking the interval before or after a first or second voltage excursion.

37. The method according to claim 29, wherein a step of checking at said first equipment said signal thus reflected includes checking the interval before or after a first or second voltage excursion.

38. The method according to claim 16, wherein a step of checking at said first equipment said signal thus reflected includes the step of checking the nominal mid-point zero-crossing of said voltage excursions.

39. The method according to claim 21, wherein a step of checking at said first equipment said signal thus reflected includes the step of checking the nominal mid-point zero-crossing of said voltage excursions.

40. The method according to claim 26, wherein a step of checking at said first equipment said signal thus reflected includes the step of checking the nominal mid-point zero-crossing of said voltage excursions.

41. The method according to claim 28, wherein a step of checking at said first equipment said signal thus reflected includes the step of checking the nominal mid-point zero-crossing of said voltage excursions.

42. The method according to claim 29, wherein a step of checking at said first equipment said signal thus reflected includes the step of checking the nominal mid-point zero-crossing of said voltage excursions.

43. The method according to claim 33, wherein a step of checking at said first equipment said signal thus reflected includes the step of checking the nominal mid-point zero-crossing of said voltage excursions.

44. The method according to claim 16, wherein a step of checking at said first equipment said signal thus reflected includes the step of checking the total extents of said voltage excursions.

45. The method according to claim 21, wherein a step of checking at said first equipment said signal thus reflected includes the step of checking the total extents of said voltage excursions.

46. The method according to claim 26, wherein a step of checking at said first equipment said signal thus reflected includes the step of checking the total extents of said voltage excursions.

47. The method according to claim 28, wherein a step of checking at said first equipment said signal thus reflected includes the step of checking the total extents of said voltage excursions.

48. The method according to claim 29, wherein a step of checking at said first equipment said signal thus reflected includes the step of checking the total extents of said voltage excursions.

49. The method according to claim 33, wherein a step of checking at said first equipment said signal thus reflected includes the step of checking the total extents of said voltage excursions.

50. The method according to claim 38, wherein a step of checking at said first equipment said signal thus reflected includes the step of checking the total extents of said voltage excursions.

51. The method according to claim 8, further comprising the step of time domain reflectometry to detect transmission line faults.

* * * * *